US012751063B2

(12) United States Patent
Xie et al.

(10) Patent No.: US 12,751,063 B2
(45) Date of Patent: Sep. 29, 2026

(54) INVERTED GATE CUT REGION

(71) Applicant: INTERNATIONAL BUSINESS MACHINES CORPORATION, Armonk, NY (US)

(72) Inventors: Ruilong Xie, Niskayuna, NY (US); Brent A. Anderson, Jericho, VT (US); Lawrence A. Clevenger, Saratoga Springs, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 456 days.

(21) Appl. No.: 18/333,819

(22) Filed: Jun. 13, 2023

(65) Prior Publication Data

US 2024/0420959 A1 Dec. 19, 2024

(51) Int. Cl.

| | |
|---|---|
| ***H10D 64/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/66*** | (2025.01) |

(52) U.S. Cl.

CPC ..... *H10D 64/01326* (2026.01); *H10D 30/014* (2025.01); *H10D 30/43* (2025.01); *H10D 30/6735* (2025.01); *H10D 62/121* (2025.01); *H10D 64/679* (2025.01)

(58) Field of Classification Search

CPC ........... H10D 64/01326; H10D 30/014; H10D 30/43; H10D 30/6735; H10D 62/121; H10D 64/679

See application file for complete search history.

(56) References Cited

U.S. PATENT DOCUMENTS

| | | | |
|---|---|---|---|
| 8,692,331 | B2 | 4/2014 | Okuno |
| 8,947,912 | B2 | 2/2015 | Calhoun |

(Continued)

OTHER PUBLICATIONS

List of IBM Patents or Patent Applications Treated as Related, Jun. 13, 2023, 2 pgs.

*Primary Examiner* — Jay C Kim
*Assistant Examiner* — Woo K Lee
(74) *Attorney, Agent, or Firm* — Seed Intellectual Property Law Group LLP

(57) ABSTRACT

A semiconductor IC device includes an inverted gate cut region with a relatively larger bottom surface area compared to its top surface area. As a result, an associated gate structure may have a relatively larger top contact landing surface area relative to its bottom surface area. The inverted gate cut region may increase a propensity of a frontside gate contact to meld with the gate structure. The increased landing area further enables the frontside contact to be placed in further perimeter locations. The inverted gate cut region also results in improved resistance characteristics through the gate structure. Specifically, the inverted gate cut region enables a wide region between a top channel and the inverted gate cut region that provides a relatively lower electrical resistance therethrough. Similarly, the inverted gate cut region causes a bottom perimeter region with decreased conductive material therein which advantageously results in lower associated parasitic capacitances.

10 Claims, 21 Drawing Sheets

(56) References Cited

U.S. PATENT DOCUMENTS

| | | | | |
|---|---|---|---|---|
| 9,048,185 | B2 | 6/2015 | Chiang | |
| 9,547,741 | B2 | 1/2017 | Schroeder | |
| 9,761,495 | B1 | 9/2017 | Xie | |
| 10,008,601 | B2 | 6/2018 | Cheng | |
| 10,176,995 | B1 | 1/2019 | Wu | |
| 10,396,206 | B2 | 8/2019 | Jha | |
| 10,840,147 | B1 | 11/2020 | Li | |
| 10,971,583 | B2 | 4/2021 | Yu | |
| 11,081,356 | B2 | 8/2021 | Wang | |
| 2019/0148373 | A1 | 5/2019 | Shi | |
| 2020/0105613 | A1 | 4/2020 | Hung et al. | |
| 2021/0125875 | A1 | 4/2021 | Tsai et al. | |
| 2021/0126109 | A1 | 4/2021 | Lin et al. | |
| 2022/0045051 | A1 * | 2/2022 | You | H10D 30/014 |
| 2022/0238388 | A1 | 7/2022 | Hiblot | |
| 2023/0047194 | A1 | 2/2023 | Chen et al. | |
| 2024/0096955 | A1 | 3/2024 | Kang et al. | |
| 2024/0420960 | A1 | 12/2024 | Xie et al. | |

* cited by examiner

300

300

INVERTED GATE CUT REGION

BACKGROUND

Various embodiments of the present disclosure generally relate to semiconductor integrated circuit (IC) device fabrication operations and resulting semiconductor IC devices. More specifically the various embodiments of the present disclosure relate to one or more transistors that are associated with a gate that includes one or more inverted gate cut regions.

Conventional semiconductor IC devices, such as integrated circuits (ICs), or the like, incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes.

One particular technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanowires, nanosheets, or the like, that are isolated from the substrate. In the GAA FET, channel surfaces are in respective contact with the source and drain and other respective channel surfaces are in contact with and surrounded by the gate.

A FET generally is a transistor in which output current, i.e., source-drain current, is controlled by a voltage applied to an associated gate. A FET typically has three terminals, i.e., a gate structure, a source region, and a drain region. A gate structure is a structure used to control output current (i.e., flow of carriers in the channel) of a semiconducting device through electrical or magnetic fields. A channel is the region of the FET underlying the gate structure and between the source and drain of the semiconductor IC device that becomes conductive when the semiconductor device is turned on. The source is a doped region in the semiconductor IC device, in which majority carriers are flowing into the channel. A drain is a doped region in the semiconductor IC device located at the end of the channel, in which carriers are flowing out of the transistor through the drain.

SUMMARY

In an embodiment of the present disclosure, a semiconductor integrated circuit (IC) device is presented. The semiconductor IC device includes a gate structure between a first gate spacer and a second gate spacer. The gate structure includes a first gate and a second gate. The semiconductor IC device further includes an inverted gate cut region between the first gate spacer and the second gate spacer. The inverted gate cut region separates the first gate from the second gate and includes a bottom surface area and a top surface area that is smaller than the bottom surface area. As a result of the inverted gate cut region, the gate structure may have a larger top contact landing surface area relative to its bottom surface area. The relatively larger top contact landing surface area may increase a propensity of a frontside gate contact to meld with the gate structure. The increased landing area further enables the frontside contact to be placed in further perimeter locations. The inverted gate cut region may also result in improved resistance characteristics through the gate structure. Similarly, the inverted gate cut region may cause a bottom perimeter region with decreased conductive material therein which advantageously results in lower associated parasitic capacitances.

In an example, the semiconductor IC device further includes an air pocket within the inverted gate cut region. The air pocket may advantageously decrease the parasitic capacitance between the first gate and the second gate.

In an example, the semiconductor IC device further includes a first transistor associated with the first gate. The first transistor includes a top channel that is vertically above a bottom channel. By vertically arranging the channels, further scaling of the semiconductor IC device may occur.

In an example, a first dimension between the top channel and the inverted gate cut region is greater than a second dimension between the bottom channel and the inverted gate cut region. This dimensional difference caused by the inverted gate cut region may result in improved resistance characteristics through the gate structure. Specifically, a region between the top channel and the inverted gate structure may be wider and have less resistance therethrough.

In an example, the gate structure is a replacement gate structure. In this way, the inverted gate cut region may be formed before or after the replacement gate structure has been formed and may separate a first replacement gate, such as a first metal gate from a second replacement gate, such as a first metal gate.

In an example, the gate structure is a sacrificial gate structure. In this way, the inverted gate cut region may be formed prior to the formation of an associated replacement gate structure and may separate a first sacrificial gate from a second sacrificial gate.

In an example, the first gate comprises a frontside contact landing area that is greater than a bottom surface area. This relatively larger top contact landing surface area may increase a propensity of a frontside gate contact to meld with the gate structure. The increased landing area further enables the frontside contact to be placed in further perimeter locations of the first gate.

In an embodiment of the present disclosure, a semiconductor integrated circuit (IC) device is presented. The semiconductor IC device includes a gate structure between a first gate spacer and a second gate spacer. The gate structure includes a first gate and a second gate. The semiconductor IC device further includes an inverted gate cut region between the first gate spacer and the second gate spacer. The inverted gate cut region separates the first gate from the second gate and comprises bottom surface width and a top surface width that is smaller than the bottom surface width. As a result of the inverted gate cut region, the gate structure may have a relatively larger top contact landing surface area relative to its bottom surface area. The relatively larger top contact landing surface area may increase a propensity of a frontside gate contact to meld with the gate structure. The increased landing area further enables the frontside contact to be placed in further perimeter locations. The inverted gate cut region may also result in improved resistance characteristics through the gate structure. Similarly, the inverted gate cut region may cause a bottom perimeter region with decreased conductive material therein which advantageously results in lower associated parasitic capacitances.

In an example, the semiconductor IC device further includes an air pocket within the inverted gate cut region. The air pocket may advantageously decrease the parasitic capacitance between the first gate and the second gate.

In an example, the semiconductor IC device further includes a first transistor associated with the first gate. The first transistor includes a top channel that is vertically above a bottom channel. By vertically arranging the channels, further scaling of the semiconductor IC device may occur.

In an example, a first distance between the top channel and the inverted gate cut region is greater than a second distance between the bottom channel and the inverted gate cut region. This dimensional difference caused inverted gate cut region may result in improved resistance characteristics through the gate structure. Specifically, a region between the top channel and the inverted gate structure may be wider and have less resistance therethrough.

In an example, the gate structure is a replacement gate structure. In this way, the inverted gate cut region may be formed before or after the replacement gate structure has been formed and may separate a first replacement gate, such as a first metal gate from a second replacement gate, such as a first metal gate.

In an example, the gate structure is a sacrificial gate structure. In this way, the inverted gate cut region may be formed prior to the formation of an associated replacement gate structure and may separate a first sacrificial gate from a second sacrificial gate.

In an example, the first gate comprises a frontside contact landing area that is greater than a bottom surface area. This relatively larger top contact landing surface area may increase a propensity of a frontside gate contact to meld with the gate structure. The increased landing area further enables the frontside contact to be placed in further perimeter locations of the first gate.

In another embodiment of the present disclosure, a method to fabricate a semiconductor integrated circuit (IC) device is provided. The method includes forming a gate structure. The method further includes forming an inverted gate cut opening by etching, in a first etch stage from a frontside of the semiconductor IC device, an angled opening within the gate structure angled toward a first active region and etching, in a second etch stage from the frontside of the semiconductor IC device, an opposing angled opening within the gate structure angled toward a second active region. The method further includes forming an inverted gate cut region within the inverted gate cut opening. The inverted gate cut region separates the gate structure into a first gate and a second gate. As a result of the inverted gate cut region, the gate structure may have a relatively larger top contact landing surface area relative to its bottom surface area. The relatively larger top contact landing surface area may increase a propensity of a frontside gate contact to meld with the gate structure. The increased landing area further enables the frontside contact to be placed in further perimeter locations. The inverted gate cut region may also result in improved resistance characteristics through the gate structure. Similarly, the inverted gate cut region may cause a bottom perimeter region with decreased conductive material therein which advantageously results in lower associated parasitic capacitances.

In an example, forming the inverted gate cut region within the inverted gate cut opening includes depositing a dielectric material within the inverted gate cut opening pinching off the dielectric material at a top of the inverted gate cut opening to form an air pocket within and surrounded by the dielectric material. The air pocket may advantageously decrease the parasitic capacitance between the first gate and the second gate.

In an example, the method further includes forming a first transistor associated with the first gate. The first transistor includes a top channel that is vertically above a bottom channel. By vertically arranging the channels, further scaling of the semiconductor IC device may occur.

In an example, a cross-sectional top distance between the top channel and the inverted gate cut region is greater than a cross-sectional bottom distance between the bottom channel and the inverted gate cut region. This dimensional difference caused inverted gate cut region may result in improved resistance characteristics through the gate structure. Specifically, a region between the top channel and the inverted gate structure may be wider and have less resistance therethrough.

In an example, the gate structure is a replacement gate structure. In this way, the inverted gate cut region may be formed before or after the replacement gate structure has been formed and may separate a first replacement gate, such as a first metal gate from a second replacement gate, such as a first metal gate.

In an example, the gate structure is a sacrificial gate structure. In this way, the inverted gate cut region may be formed prior to the formation of an associated replacement gate structure and may separate a first sacrificial gate from a second sacrificial gate.

These and other embodiments, features, aspects, and advantages will become better understood with reference to the following description, appended claims, and accompanying drawings.

DETAILED DESCRIPTION

Figure 1:
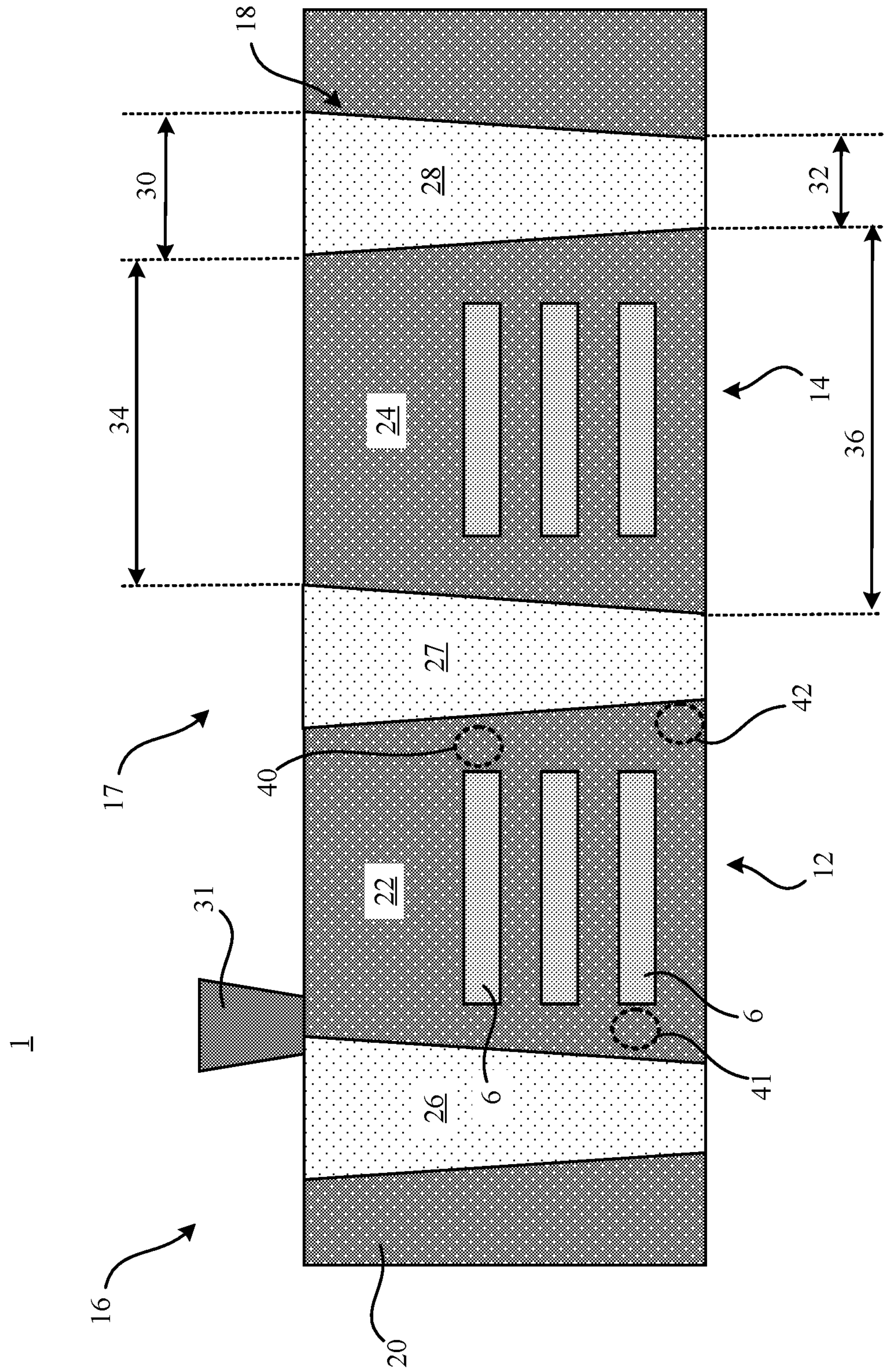
FIG. 1 depicts a gate structure that is separated into distinct gate structures by a trapezoidal orientated gate cut region.

Referring to FIG. 1, which depicts a semiconductor IC device 1, embodiments of the present disclosure recognize that a single gate structure 20 may be separated into electrically distinct gate structures 22, 24 by the formation of one or more gate cut region(s) 27, 26, and/or 28 therewithin. Gate cut regions 26, 27, and/or 28 are typically formed by filling, with a dielectric or other electrically isolating material, a respective gate cut opening 16, 17, and/or 18 that has been formed within the gate structure 20. A gate cut etch typically removes the one or more portion(s) of the gate structure 20, thereby forming the gate cut openings 16, 17, and/or 18. The gate cut opening 17 and the associated gate cut region 27 is located between a first active region 12 and a second active region 14 of the semiconductor IC device 1. The gate cut region 27 is located within gate structure 20 in a location to provide isolation between the active regions 12, 14 of the semiconductor IC device. Removing the portion of the gate structure, separating the first active region 12 from the second active region 14, defines two separate gate structures, i.e., a first gate structure 22 associated with the first active region 12, and a second gate structure 24 associated with the second gate structure 24, that are separated by the gate cut region 27.

The gate cut etch is typically an etch from the frontside of the semiconductor IC device 1, such as an anisotropic etch of crystallographic material, or the like, that results in sloped or angled sidewalls of gate cut openings 16, 17, and/or 18 and gate cut regions 26, 27, and/or 28, respectively. In other words, the gate cut etch typically results in trapezoidal orientated gate cut regions 26, 27, and/or 28 that have a larger top (i.e., frontside) dimension 30 that is parallel to the gate width compared to a bottom (i.e., backside) dimension 32 that is parallel to the gate width. As a result, a top dimension 34 of gate structure 22 and of gate structure 24 along the gate width is typically smaller than a bottom dimension 36 of gate structure 22 and of gate structure 24 along the gate width.

Consequently, trapezoidal orientated gate cut regions typically result in a relatively smaller top surface area of gate structure 22 and of gate structure 24 compared to a bottom surface area of gate structure 22 and of gate structure 24. As the top surface of gate structure 22 and of gate structure 24 is typically a landing area for a frontside gate contact 31, trapezoidal orientated gate cut regions may reduce the landing area of a respective frontside gate contact 31 to the gate structure 22 and to the gate structure 24. Because of the reduced landing area, there is an increased propensity of the frontside gate contact 31 to be misaligned to the underling gate structure 22, as depicted.

Further, trapezoidal orientated gate cut regions typically result in nonoptimal resistance characteristics within the gate structures 22, 24. Specifically, the trapezoidal orientated gate cut regions typically result in a narrow region 40 of the gate structure between a top channel 6 and the gate cut region with a relatively higher electrical resistance therethrough compared to a resistance through a wide region 41 of the gate structure between a bottom channel 8 and the gate cut region. Similarly, the trapezoidal orientated gate cut regions typically result in a bottom perimeter region 42 of surplus metal nearest the gate structure's bottom surface perimeter edge which contributes to parasitic capacitance of the semiconductor IC device 1.

Although this detailed description includes examples of how embodiments of the disclosure can be implemented to form a semiconductor IC device with GAA FETs, implementation of the teachings recited herein are not necessarily limited to a particular type of FET structure or combination of materials depicted or described. Rather, embodiments of the present disclosure are capable of being implemented in conjunction with other transistor types or materials, now known or later developed, wherein it is desirable for the semiconductor IC device to include a gate structure with an inverted gate cut region, according to one or more disclosed embodiments.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor IC devices are well known and so, in the interest of brevity, many conventional steps will only be mentioned briefly herein or will be omitted entirely without providing the well-known process details.

In general, the various processes used to form a semiconductor IC device that will be packaged into a final or packaged IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Turning now to a description of technologies that are more specifically relevant to the present disclosure, transistors are a type of microdevice commonly found in a wide variety of semiconductor IC devices. Typical semiconductor IC devices may be formed using or within active regions of a wafer. The active regions are defined by isolation regions used to separate and electrically isolate the adjacent active regions.

An representative semiconductor IC device depicted herein includes a plurality of GAA FETs. Each GAA FET has a source and a drain that are formed in an active region of a semiconductor layer by implanting n-type or p-type impurities in the respective source and the drain material. Disposed between the source and the drain is a channel, or body region, hereinafter referred to as a channel. Disposed around the channel is the gate structure. The gate structure, the source, and the gate and the drain are spaced apart by a dielectric layer or spacer.

The representative GAA FETs may be fabricated using so-called complementary metal oxide semiconductor (CMOS) fabrication technologies. In general, CMOS is a technology that uses complementary and symmetrical pairs of p-type and n-type MOSFETs to implement logic functions. The channel connects the source and the drain, and electrical current flows through the channel region from the source to the drain. The electrical current flow is induced in the channel region by a voltage applied at the gate structure.

The wafer footprint of a GAA FET is related to the electrical conductivity of the channel material. If the channel material has a relatively high conductivity, the GAA FET can be made with a correspondingly smaller wafer footprint. A known method of increasing channel conductivity and decreasing GAA FET size is to form the channel as a one or more nanolayers, such as nanowires, or nanosheets. These GAA FETs provide a relatively small FET footprint by forming the channel as a series of vertical nanolayers.

In a known GAA configuration, a nanolayer-based FET includes a source region, a drain region, and stacked nanolayer channels between the source and drain regions. A gate surrounds the stacked nanolayer channels and regulates electron and hole flow through the nanolayer channels between the source and drain regions. GAA FETs may be fabricated by forming alternating layers of channel nanolayer and sacrificial nanolayer layers. The sacrificial nanolayer layers are released from the channel nanolayers before the GAA FET device is finalized. For n-type GAA FETs, the channel nanolayer layers may be silicon (Si) and the sacrificial nanolayer layers may be silicon germanium (SiGe). For p-type GAA FETs, in some implementations, the channel nanolayer layers may be SiGe and the sacrificial nanolayer layers may be Si. In other implementations, p-type GAA FETs, the channel nanolayer may be Si, and the sacrificial nanolayer can be SiGe. In some implementations, the channel nanolayer layers may initially be Si and can be converted to SiGe or other material, after sacrificial nanolayer layers are removed.

Turning now to a more detailed description of fabrication operations and resulting structures according to embodiments of the disclosure, FIG. 2 through FIG. 12 and FIG. 14 through FIG. 18 depict semiconductor IC devices that includes, or is to include, a gate structure with an inverted gate cut region therein, after various fabrication operations. For ease of illustration, the fabrication operations depicted therein will be described in the context of forming elements of GAA FET(s). The cross-sectional structural diagrams depicted in the drawings are two-dimensional, through the semiconductor IC devices is a three-dimensional device. The depicted cross-sectional planes are chosen to best show the features of the semiconductor IC device. For example, an X cross-sectional view and a Y cross-sectional view are defined upon a partial top-view of the semiconductor IC device. The representative X cross-sectional view is a vertical cross-section through an active region across neighboring gates and the representative Y cross-sectional view is a vertical cross-section through a gate across neighboring active regions.

For clarity, the representative fabrication stages depicted in FIG. 2 through FIG. 12 and FIG. 14 through FIG. 18 may be used to fabricate the various semiconductor IC devices depicted and described herein. For example, the fabrication stages depicted in FIG. 2 through FIG. 12 may be used to also fabricate semiconductor IC device 100 that includes a gate structure with an inverted gate cut region therein using a gate last process where the inverted gate cut region is formed prior to formation of the final gate structure. Similarly, the fabrication stages depicted in FIG. 14 through FIG. 18 may be used to also fabricate semiconductor IC device 300 with an inverted gate cut region therein using a gate first process where the inverted gate cut region is formed after the final gate structure is formed.

Figure 2:
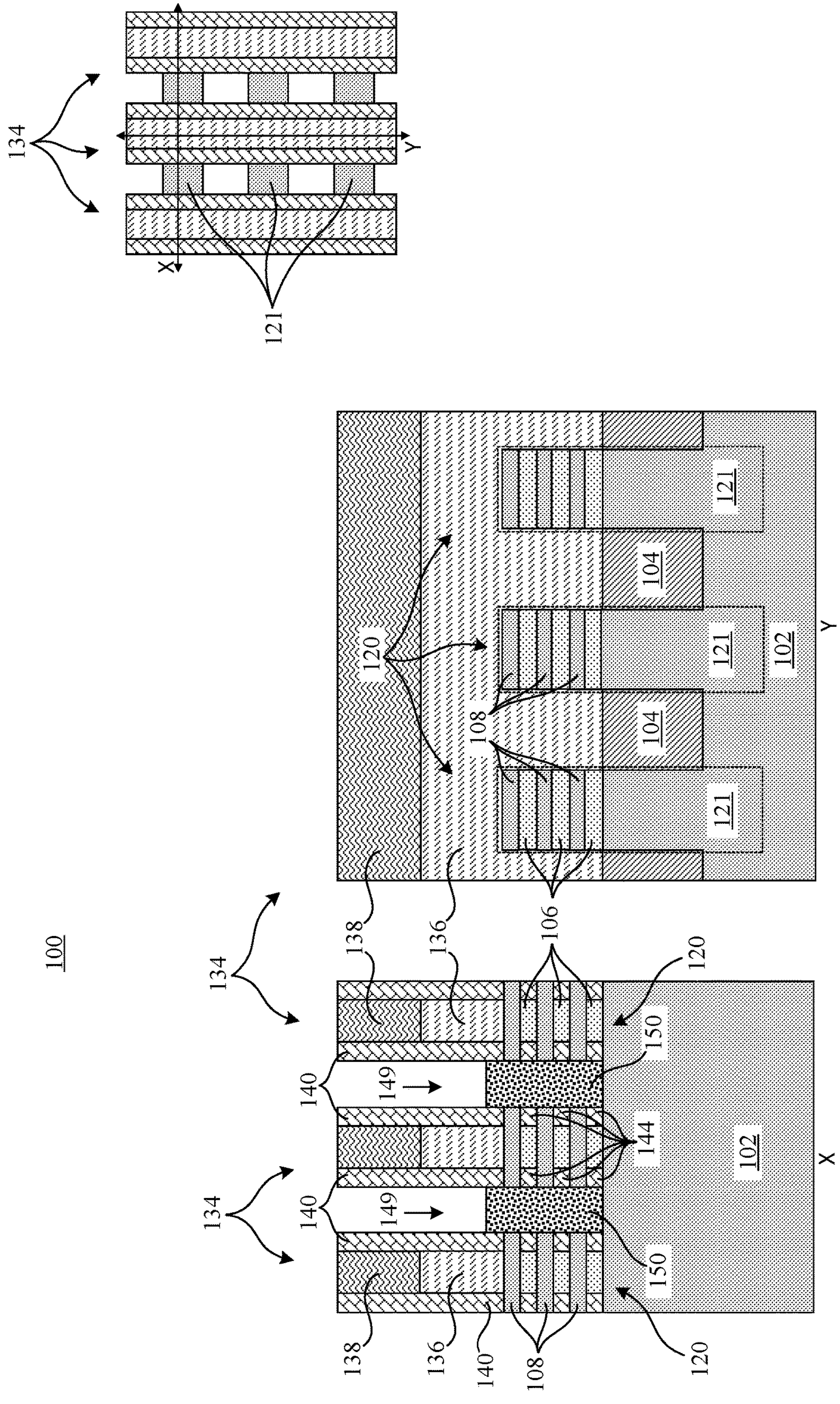
FIG. 2 through FIG. 12 depict fabrication stage views of a semiconductor IC device that includes a gate structure that is separated into distinct gate structures by an inverted gate cut region, in accordance with one or more embodiments of the disclosure.

FIG. 2 depicts a cross-sectional view of the semiconductor IC device 100 after initial fabrication operations, in accordance with embodiments of the present disclosure. In these initial fabrication stages, nanolayers are formed upon a substrate 102, one or more nanolayer stacks 120 are patterned from the nanolayers, shallow trench isolation (STI) regions 104 are formed, one or more sacrificial gate structures 134 are formed, gate spacers 140 are formed upon the side(s) of the one or more sacrificial gate structures 134, the one or more nanolayer stacks are recessed, the sacrificial nanolayers 106 underneath the gate spacers 140 are indented, inner spacers 144 are formed within the indents, and one or more source/drain (S/D) regions 150 are formed.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Nanolayers may be formed by forming an alternating series of sacrificial nanolayers 106, such as SiGe sacrificial nanolayers, and active nanolayers 108, such as Si nanolayers, upon the substrate 102. The sacrificial nanolayers 106 can have Ge % ranging from 20% to 45%. In an implementation, the bottom most sacrificial nanolayer 106 may be epitaxially grown from the substrate 102 and the alternating active nanolayer 108 and sacrificial nanolayer 106 may be formed by epitaxially growing one layer and then the next until the desired number and desired thicknesses of the layers are achieved. Any number of alternating nanolayers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or formation," or the like, is defined herein as the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on other exposed surfaces, such as silicon dioxide or silicon nitride surfaces.

In some embodiments, the active nanolayers 108 are formed from Si and can include, for example, monocrystalline Si. The active nanolayers 108 can have a thickness of, for example, from about 4 to about 12 nm. In embodiments the sacrificial nanolayers 106 are formed from SiGe and the sacrificial nanolayers 106 can have a thickness of, for example, from about 4 to about 12 nm. The sacrificial nanolayers 106 can have Ge % ranging from 20% to 45%. In some embodiments, the sacrificial nanolayers 106 are formed of a material that has etch selectivity to the material used to from the active nanolayers 108.

The one or more nanolayer stacks 120 may be patterned by forming a mask layer (not shown), that may be used to pattern the nanolayers into nanolayer stacks 120, upon the top nanolayer. The mask layer may be patterned by photolithography which transfers the pattern to and within the mask layer. The material of the mask layer that is associated with the pattern may be removed which thereby resultantly exposes portions of the underlying top nanolayer while the other portions of the mask layer protect the underlying nanolayers.

The one or more nanolayer stacks 120 may be patterned by removing respective undesired portion(s) or section(s) of the sacrificial nanolayers while retaining respective desired portions thereof. The retained portions of the nanolayers may resultantly define respective active regions 121 of the semiconductor IC device 100. The removal of undesired portions of the nanolayers can be accomplished using, for example, an etch processes. The desired portions of the nanolayers may be protected by the patterned mask layer and resultingly form the one or more nanolayer stacks 120.

The removal of such undesired nanolayer portions may further remove undesired portions of substrate 102 that are adjacent to respective footprints of nanolayer stacks 120 to form STI region openings. The etch may be timed or otherwise controlled to stop the removal of the substrate 102 such that the depth or bottom of the one or more STI region openings has a predetermined or desired dimension. Alternatively, the etch may utilize an etch stop layer (not shown) that is internal to the substrate 102 to effectively stop the etch so as to form the depth or bottom of the one or more STI region openings.

A STI region 104 may be formed upon the substrate 102 below and adjacent to the nanolayer stacks 120 within the STI region openings. For example, one or more STI regions 104 may be formed by depositing isolation material within the STI region openings adjacent to the one or more nanolayer stacks 120. In the embodiment depicted, a top surface of the one or more STI regions 104 may be coplanar with a top surface of substrate 102. STI region(s) 104 may be formed by depositing isolation material upon the substrate 102 to a thickness such that the top surface of the isolation material is above the upper substrate 102, followed by STI dielectric material etch back, recess, or the like. The one or more STI regions 104 may have a volume that sufficiently electrically isolates components or features of neighboring transistors, or the like, and/or may sufficiently electrically isolates neighboring active regions 121.

Further, in the depicted fabrication stage, one or more sacrificial gate structures 134 are formed upon the one or more STI regions 104 and upon and around the one or more nanolayer stacks 120. The one or more sacrificial gate structures 134 may include a sacrificial gate liner (not shown), a sacrificial gate 136, and a sacrificial gate cap 138.

The sacrificial gate structures 134 may be formed by initially depositing a sacrificial gate liner layer (e.g., a dielectric, oxide, or the like) upon the one or more STI regions 104 and upon and around the one or more nanolayer stacks 120. The sacrificial gate structures 134 may further be formed by subsequently depositing a sacrificial gate layer (e.g., amorphous silicon, or the like) upon the sacrificial gate liner layer. The thickness of the sacrificial gate layer may be such that the top surface of the sacrificial gate layer is above the top surface of the one or more nanolayer stacks 120. The sacrificial gate structure 134 may further be formed by forming a gate cap layer upon the sacrificial gate layer. The gate cap layer may be formed by depositing a mask material, such as a hard mask material, such as silicon nitride, silicon oxide, combinations thereof, or the like, upon the sacrificial gate layer. The gate cap layer may be composed of one or more layers of masking materials to protect the sacrificial gate layer and/or other underlying materials during subsequent processing of semiconductor IC device 100.

The one or more sacrificial gate structures 134 may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner (not shown), the sacrificial gate 136, and the sacrificial gate cap 138, respectively, of each of the one or more sacrificial gate structures 134.

One or more sacrificial gate structures 134 can be formed on targeted regions or areas of semiconductor IC device 100 to define the length of one or more GAA FETs, length of one or more CMOS FET channels, and to provide sacrificial material for yielding targeted GAA FET structure(s) in subsequent processing. According to an example, each sacrificial gate structure 134 can have a height of between approximately 50 nm and approximately 200 nm, and a length of between approximately 10 nm and approximately 200 nm.

As depicted in the Y cross-section, the one or more of the sacrificial gate structures 134 can be formed upon the STI regions 104 and upon respective top, front, and rear sides of the one or more nanolayer stacks 120.

One or more gate spacers 140 may be respectively formed upon the one or more STI regions 104, may be respectively formed upon and around the one or more nanolayer stacks 120, and may be formed upon and around the one or more sacrificial gate structures 134. In one example, gate spacers 140 may be formed of a dielectric material(s), such as such as silicon nitride, SiBCN, SiNC, SiN, SiCO, SiNOC, or a combination thereof.

The one or more gate spacers 140 may be formed by a deposition of a blanket dielectric material, such as such as silicon nitride, SiBCN, SiNC, SiN, SiCO, SiNOC, or a combination thereof. Excess, undesired, and/or exposed blanket dielectric material may be subsequently removed by a substrative removal technique, such as an etch. For example, a directional etch may remove exposed horizontal portion(s) of the blanket dielectric material while also leaving vertical portion(s) of the blanket dielectric material that are upon the sidewalls of the one or more sacrificial gate structures 134 intact.

Further, in the depicted fabrication stage, source/drain (S/D) recesses 149 are formed within the one or more nanolayer stacks 120 between gate spacers 140 that are associated with neighboring sacrificial gate structures 134. In other words, as depicted in the X cross-section view, a single nanolayer stack 120 may be separated into multiple nanolayer stacks 120 by one or more S/D recesses 149.

The one or more S/D recesses 149 may be formed between adjacent sacrificial gate structures 134 by removing the portions of the sacrificial nanolayers 106 and by removing the portions of the active nanolayers 108 that are between gate spacers 140 of adjacent or neighboring sacrificial gate structures 134. The one or more S/D recesses 149 may be formed to a depth to stop at the substrate 102. In this manner, a respective nanolayer stack 120 is separated and respective portions of the sacrificial nanolayers 106 and the active nanolayers 108 that are located below the gate spacers 140 and below the sacrificial gate structures 134 are retained. The undesired portions of the nanolayers may be removed by etching or other subtractive removal techniques. The top surface of the substrate 102 may be used as an etch stop or other etch parameters may be controlled to stop the material removal at the upper substrate 102. The retained one or more portions of one or more nanolayer stacks 120 may be such portions thereof that were protected generally below and/or internal to respective sacrificial gate structures 134 and/or by the associated gate spacers 140.

The sacrificial nanolayers 106 within the nanolayer stacks 120 and that are underneath the gate spacer 140 may be indented, thereby forming an indent void, and a respective inner spacer 144 may be formed within an indent void.

The indent voids underneath respective gate spacers 140 may be formed by a directional reactive ion etch (RIE) process, which can remove or indent portions of the sacrificial nanolayers 106 that are not covered by the sacrificial gate 136 and/or that are under the gate spacers 140. The RIE can use a boron-based chemistry or a chlorine-based chemistry, for example, which selectively recesses the exposed portions sacrificial nanolayers 106 (e.g., those portions of sacrificial nanolayers 106 generally below spacer(s) 140, etc.) without significantly removing the active nanolayers 108, within the one or more nanolayer stacks 120.

Subsequently, a respective inner spacer 144 may be deposited in the indent void that was previously formed into the respective sacrificial nanolayer 106. In certain embodiments, the material of the inner spacer 144 is a dielectric material such as SiN, SiO, SiBCN, SiOCN, SiCO, etc. In certain implementations, after the formation of the inner spacers 144, an isotropic etch process is performed to create outer vertical edges or sidewalls of the inner spacers 144 that are coplanar or align with outer vertical edges or sidewalls of the active nanolayers 108 and/or the outer vertical edges or sidewalls of the gate spacers 140.

The one or more S/D regions 150 are formed of a material that can form either a source or a drain, respectively. S/D regions 150 may be epitaxially grown or formed. A S/D region 150 may be formed by epitaxially growing epitaxial material upon the substrate 102 within a S/D recess 149 between neighboring sacrificial gate structures 134.

In some embodiments, the epitaxial growth of S/D regions 150 may overgrow above the upper surface of the top nanolayer. Subsequently, the S/D regions 150 may be etched back. The etch may be timed or otherwise controlled to stop the removal of S/D regions 150 such that the top surface(s) thereof are above the topmost active nanolayer 108 and below the top surface of sacrificial gate 136.

In some examples, S/D regions 150 are formed by in-situ doped epitaxial growth. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into S/D regions 150. Other doping techniques can be used to incorporate dopants in the S/D regions 150. Dopant techniques include but are not limited to, ion implantation, gas phase doping, plasma doping, plasma immersion ion implantation, cluster doping, infusion doping, liquid phase doping, continuous phase doping, in-situ epitaxy growth, or any suitable combination of those techniques. In preferred embodiments, the S/D epitaxial growth conditions that promote in-situ Boron doped SiGe for p-type transistors and phosphorus or arsenic doped silicon or Si:C for n-type transistors. The doping concentration in the S/D regions 150 can be in the range of 1×1019 cm-3 to 2×1021 cm-3, or preferably between 2×1020 cm-3 to 7×1020 cm-3. In a particular example, the S/D regions 150 may be doped to form n-type S/D regions 150 and resultant n-type transistors. In another example, the S/D regions 150 may be doped to form p-type S/D regions 150 and resultant p-type transistors.

Figure 3:
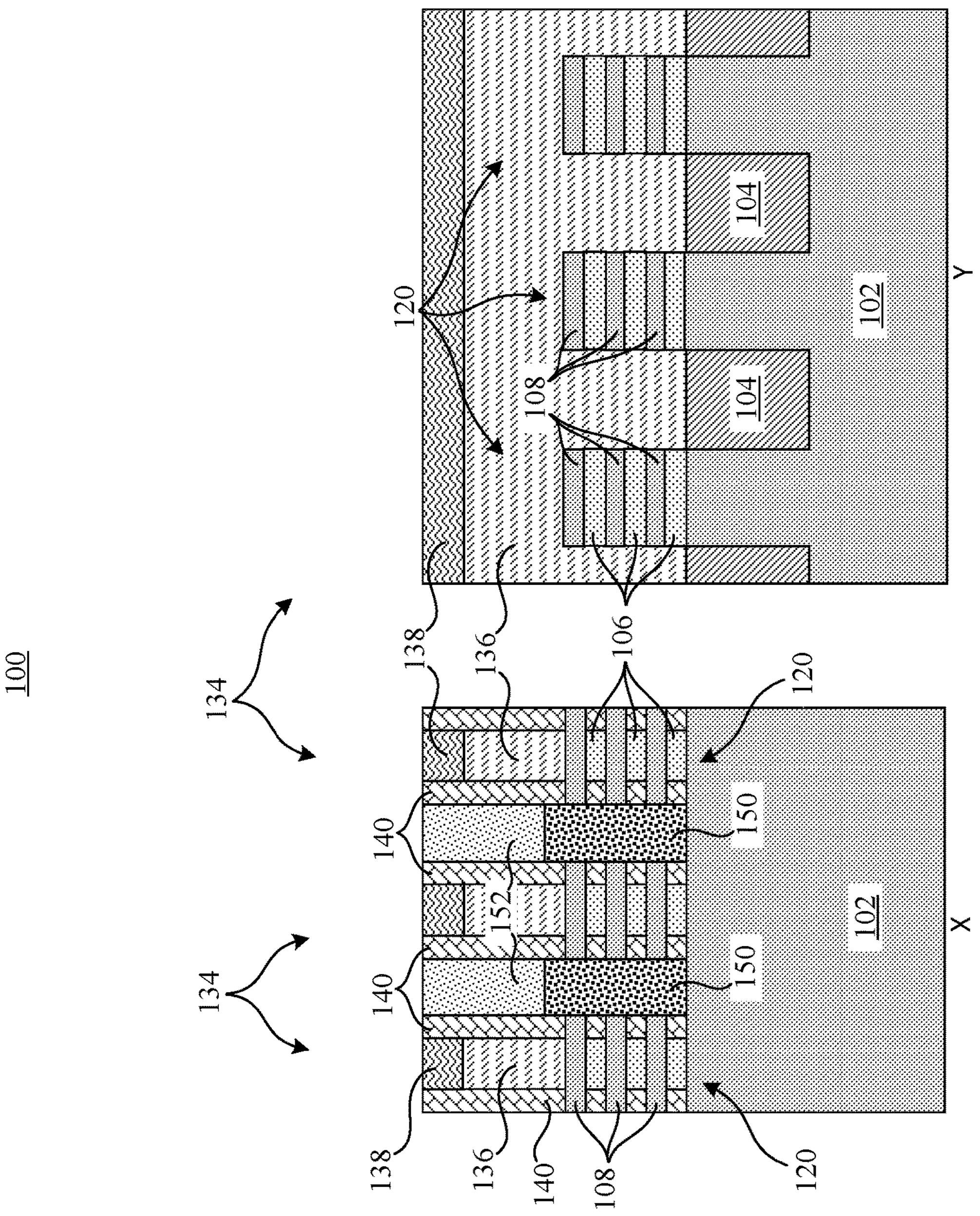

FIG. 3 depicts cross-sectional views of semiconductor IC device 100 shown after representative fabrication operation(s), in accordance with one or more embodiments. In the depicted fabrication stage, an interlayer dielectric (ILD) 152 is formed upon and around the S/D regions 150, upon gate spacers 140, upon STI region(s) 104, and the like.

The ILD 152 can be any suitable material, such as, for example, porous silicates, carbon doped oxides, silicon dioxides, silicon nitrides, silicon oxynitrides, or other dielectric materials. The ILD 152 can be formed using, for example, CVD, PECVD, ALD, flowable CVD, spin-on dielectrics, or PVD. In an example, the ILD 152 may be formed to a thickness above the top surface of the semiconductor IC device 100 and subsequently etched back such that the top surface of the ILD 152 is coplanar with a top surface of the sacrificial gate cap 138 and/or a top surface of gate spacers 140. In another example, after deposition of the ILD 152 a planarization process, such as a chemical mechanical polish (CMP), may be performed to create a planar upper surface for the semiconductor IC device 100. For example, respective top surfaces of the ILD 152, gate spacers 140, and sacrificial gate 136 or sacrificial gate cap 138 may be horizontally coplanar.

Figure 4:
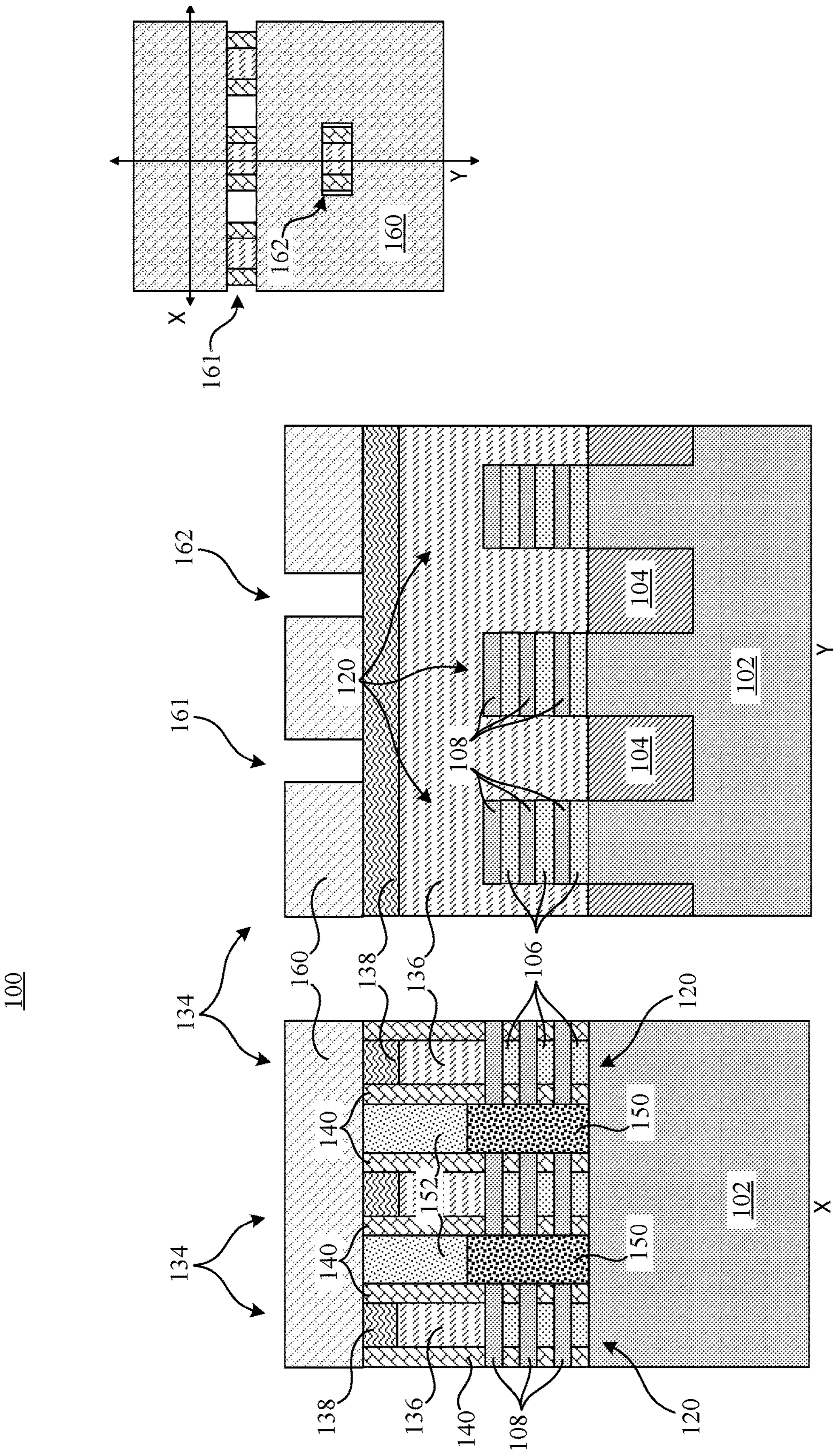

FIG. 4 depicts cross-sectional views of semiconductor IC device 100 shown after representative fabrication operation(s), in accordance with one or more embodiments. In the depicted fabrication stage, a gate cut mask 160 is formed and patterned to create a gate cut opening 162 over a single sacrificial gate structure 134 and/or a gate cut trench 161 over multiple sacrificial gate structures 134.

A gate cut mask 160 which may consist of a nitride material, such as, but not necessarily limited to, silicon nitride (SiN) or titanium nitride (TiN), a low temperature oxide, such as an organic planarization layer (OPL), may be formed on the sacrificial gate structures 134, on the ILD 152, on the gate spacers 140. The gate cut mask 160 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. A height of the gate cut mask 160 can be in the range of, but is not necessarily limited to, 20 nm to 100 nm.

Subsequently, a photoresist (not shown) may be formed over the gate cut mask 160. The photoresist may include a positive-tone photoresist composition, a negative-tone photoresist composition, or a hybrid-tone photoresist composition. A layer of photoresist material may be formed by a deposition process such as, for example, spin-on coating.

The deposited photoresist is subjected to a pattern of irradiation, and the exposed photoresist material is developed utilizing resist developer. The pattern provided by the patterned photoresist material is transferred through the gate cut mask 160 to form the gate cut opening 162 and/or the gate cut trench 161. According to various embodiments, the areal dimensions of the gate cut opening 162 and/or the gate cut trench 161 are within lithography process windows for forming such structures.

The pattern transfer etching process to form the gate cut opening 162 and/or the gate cut trench 161 may be an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Figure 5:
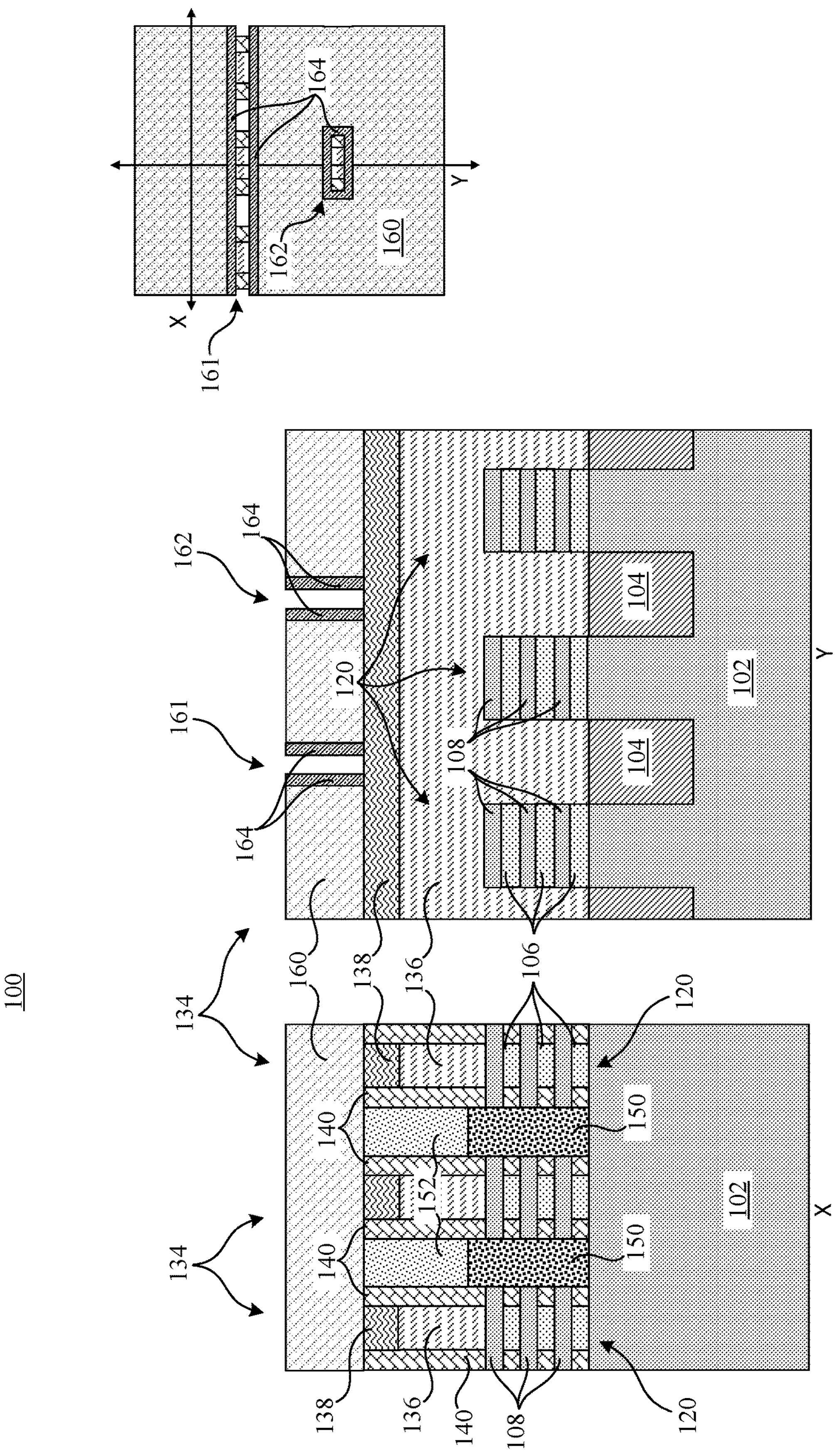

FIG. 5 depicts cross-sectional views of semiconductor IC device 100 shown after representative fabrication operation(s), in accordance with one or more embodiments. In the depicted fabrication stage, a spacer layer 164 is formed within the gate cut opening 162 and/or the gate cut trench 161. The spacer layer 164 may be formed by deposited a layer of titanium oxide, silicon dioxide or silicon nitride, or the like, upon the sidewall(s) of the gate cut opening 162 and/or the gate cut trench 161, upon the gate spacer(s) 140, upon the sacrificial gate cap 138, and/or upon the ILD 152, as appropriate. The spacer layer 164 may be used to control, i.e., decrease, the critical dimension of the gate cut opening 162 and/or the gate cut trench 161. A thickness of the spacer layer 164 may be 3 to 6 nm, for example, though other thicknesses may be useful in various implementations. In an example, the spacer layer 164 is deposited as a conformal layer over the semiconductor IC device 100 of FIG. 4, followed by an anisotropic etch to remove the spacer layer 164 material from horizontal surfaces.

Figure 6:
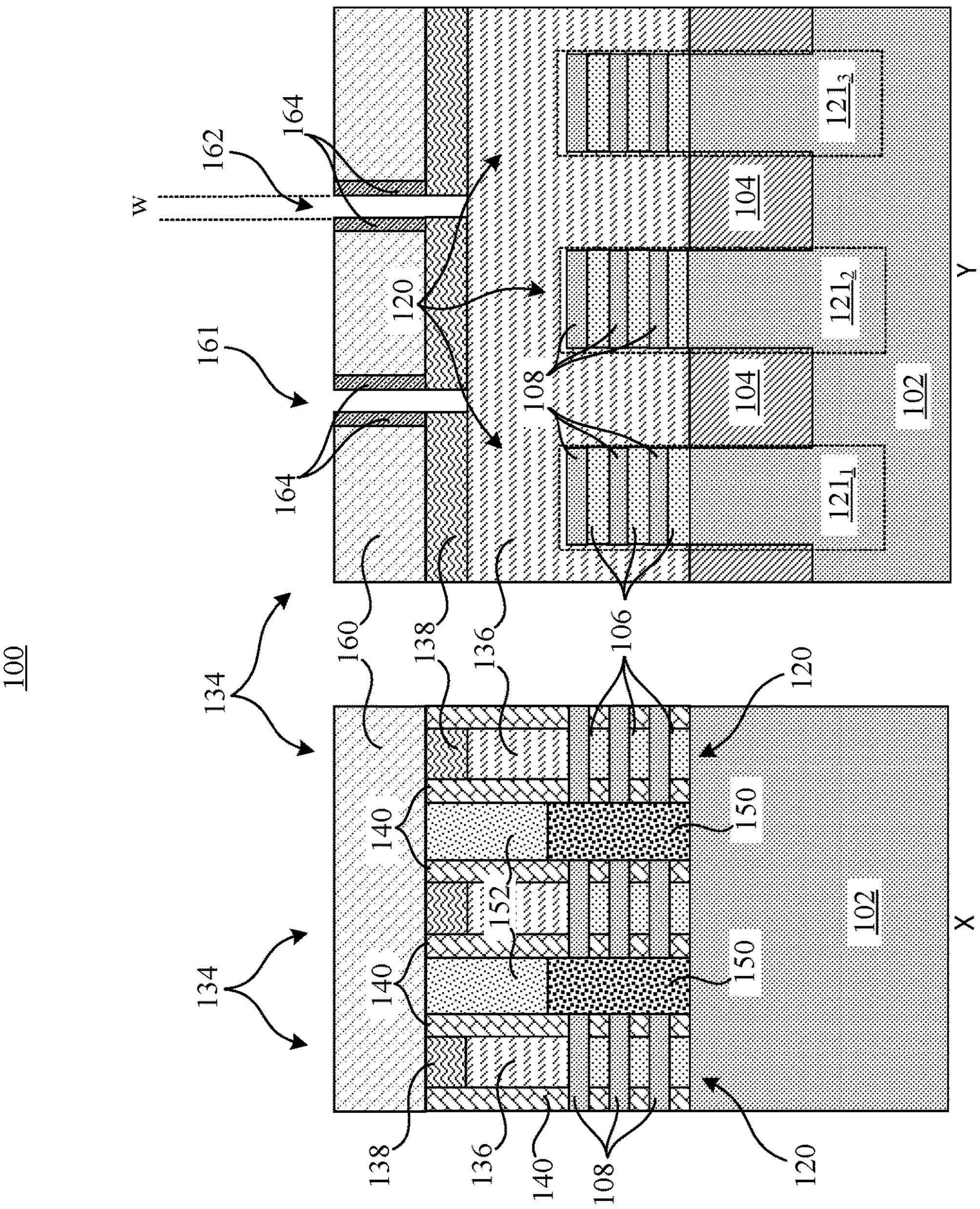

FIG. 6 depicts cross-sectional views of semiconductor IC device 100 shown after representative fabrication operation(s), in accordance with one or more embodiments. In the depicted fabrication stage, using the gate cut mask 160 and the spacer layer 164 as an etch mask, the gate cut opening 162 and/or the gate cut trench 161 is etched into the sacrificial gate cap 138. The etch of the sacrificial gate cap(s) 138 may generally stop at the sacrificial gate 136 or otherwise expose the sacrificial gate 136 thereunder.

In certain embodiments, the spacer layer 164 is adapted to function as a sacrificial masking layer that, in conjunction with an anisotropic etch of the sacrificial gate cap 138, defines the areal dimensions of the gate cut opening 162 and/or the gate cut trench 161 therewithin. The gate cut opening 162 and/or the gate cut trench 161 within the one or more sacrificial gate cap(s) 138 may have areal dimensions (length and width) that independently range from 10 to 40 nm, e.g., 10, 15, 20, 25, 30, 35 or 40 nm, including ranges between any of the foregoing values, although lesser and greater dimensions may be used. As shown in the Y cross-section view, a lateral dimension (w) of the gate cut opening 162 and/or the gate cut trench 161 within the one or more sacrificial gate cap(s) 138 is defined by the spacer layer 164, such that the gate cut opening 162 and/or the gate cut trench 161 within the one or more sacrificial gate cap(s) may be defined with substantially vertical sidewalls. As used herein, "substantially vertical" sidewalls deviate from a direction normal to a major surface (e.g., top surface, etc.) of the substrate 102 by less than 5°, e.g., 0°, 1°, 2°, 3°, 4°, or 5°, including ranges between any of the foregoing values. In certain embodiments, the width (w) of the gate cut opening 162 and/or the gate cut trench 161 is less than 20 nm, e.g., 5, 10 or 15 nm.

During etching of the sacrificial gate cap(s) 138 to form the gate cut opening 162 and/or the gate cut trench 161 therein, the materials adjacent to the perimeter footprint of the gate cut opening 162 and/or the gate cut trench 161 is protected by the overlying gate cut mask 160. Therefore, the sacrificial gate cap 138 material adjacent to the gate cut opening 162 and/or the gate cut trench 161 can mechanically support the spacer layer 164.

For clarity, the gate cut opening 162 may be located between active region $\mathbf{121}_2$ and active region $\mathbf{121}_3$. For example, a same vertical bisector may be shared by the gate cut opening 162, by active region $\mathbf{121}_2$, and by active region $\mathbf{121}_3$. Similarly, the gate cut trench 161 may be located vertically in the middle of active region $\mathbf{121}_1$ and active region $\mathbf{121}_2$. For example, a same vertical bisector may be shared by the gate cut trench 161, by active region $\mathbf{121}_1$, and by active region $\mathbf{121}_2$.

Figure 7:
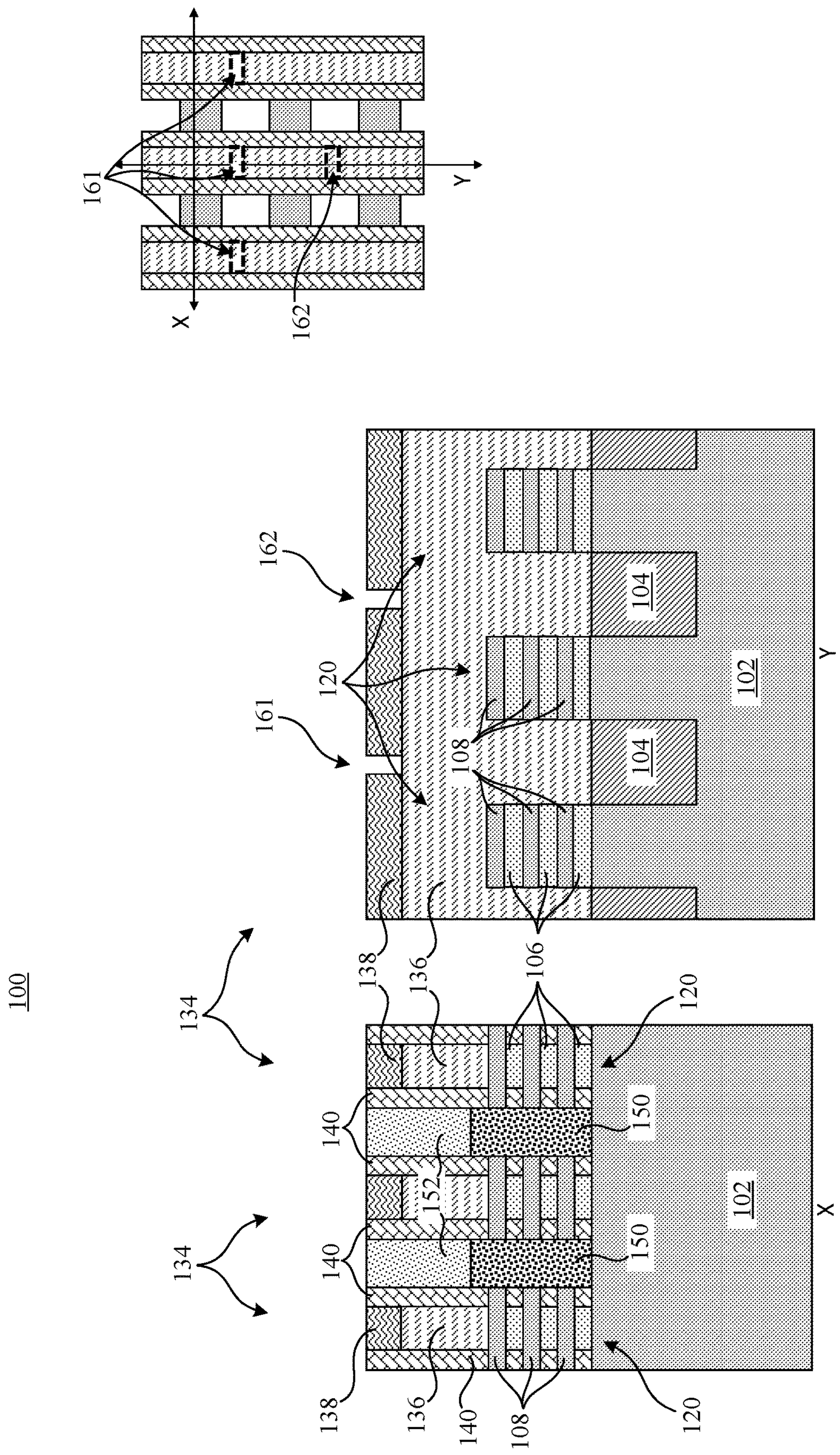

FIG. 7 depicts cross-sectional views of semiconductor IC device 100 shown after representative fabrication operation(s), in accordance with one or more embodiments. In the depicted fabrication stage, the gate cut mask 160 and the spacer layer 164 are removed by one or more subtractive removal technique(s). For example, the gate cut mask 160 and the spacer layer 164 may be removed by an etch, OPL ash, or the like.

In an example depicted, the gate cut opening 162 and/or the gate cut trench 161 is transferred solely into one or more sacrificial gate cap(s) 138. Consequently, as is exemplarily depicted, the gate cut opening 162 and/or the gate cut trench 161 does not extend into the gate spacers 140 on either side of the one or more sacrificial gate caps 138.

Figure 8:
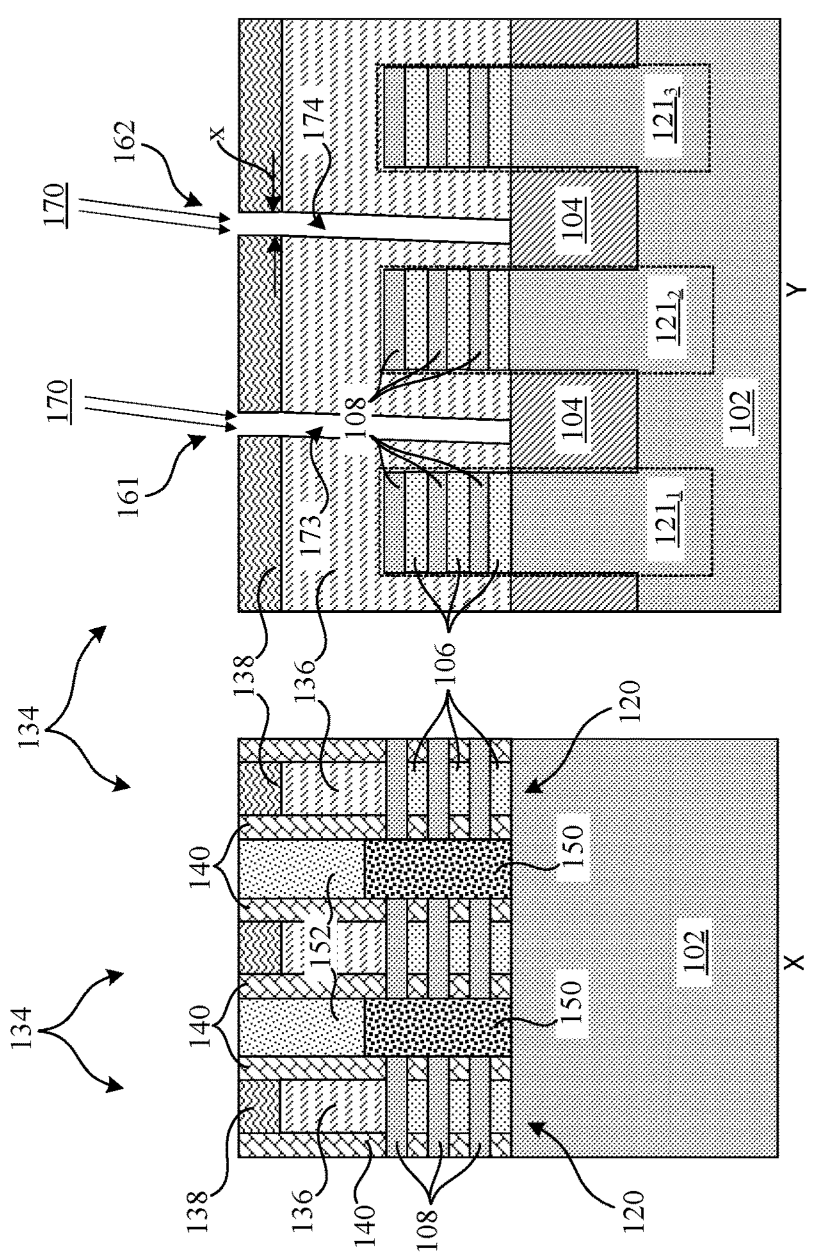

FIG. 8 depicts cross-sectional views of semiconductor IC device 100 shown after representative fabrication operation(s), in accordance with one or more embodiments. In the depicted fabrication stage, using the gate cut mask 160, the gate cut opening 162 and/or the gate cut trench 161 is etched in a first etch stage, by a highly directional beam of ions 170 that are angled relative to the semiconductor IC device 100, into the sacrificial gate 136. The angled etch of the sacrificial gate 136 may generally stop at the STI region 104 between neighboring nanosheet stacks 120 or otherwise expose the STI region 104 thereunder.

In certain embodiments, the sacrificial gate cap(s) 138 is adapted to function as a sacrificial masking layer that, in conjunction with the ion base etch (e.g., RIE, or the like) of the sacrificial gate 136, defines the areal dimensions of the gate cut opening 162 and/or the gate cut trench 161 within the sacrificial gate(s) 136. The gate cut opening 162 and/or the gate cut trench 161 within the one or more sacrificial gate(s) 136 may have areal dimensions (length and width) that independently range from 10 to 40 nm, e.g., 10, 15, 20, 25, 30, 35 or 40 nm, including ranges between any of the foregoing values, although lesser and greater dimensions may be used. As shown in the Y cross-section view, a wall to wall dimension (x) of the gate cut opening 162 and/or the gate cut trench 161 within the one or more sacrificial gate(s) 136 is defined by the associated gate cut opening 162 and/or the gate cut trench 161 within the sacrificial gate cap(s) 138, there above, such that the gate cut opening 162 and/or the gate cut trench 161 within the one or more sacrificial gate(s) 136 may be defined with substantially parallel sidewalls that are substantially angled relative to the major surface of the substrate 102. In certain embodiments, the width (x) of the gate cut opening 162 and/or the gate cut trench 161 within the one or more sacrificial gate(s) 136 is less than 20 nm, e.g., 5, 10 or 15 nm.

As used herein, "substantially parallel" sidewalls deviate relative thereto by less than 5°, e.g., 0°, 1°, 2°, 3°, 4°, or 5°, including ranges between any of the foregoing values. Similarly, as used herein, "substantially angled" sidewalls deviate from the direction normal to the major surface (e.g., top surface, etc.) of the substrate 102 by more than 5°, e.g., 6°, 7°, 8°, 9°, 10°, or greater, including ranges between any of the foregoing values.

Figure 20:
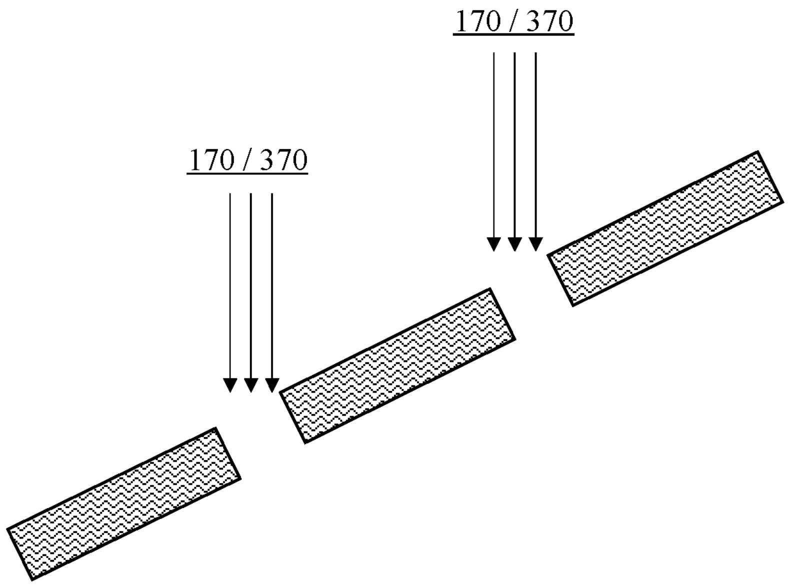
FIG. 20 and FIG. 21 depict alternative fabrication techniques of multiple etch fabrication stages where a semiconductor IC device is angled relative to directional etch ions to form an inverted gate cut region, in accordance with one or more embodiments of the disclosure.

The highly directional beam of ions 170 may angled relative to the semiconductor IC device 100 by first directing the highly directional beam of ions 170 toward the semiconductor IC device 100 in the direction normal to the major surface (e.g., top surface, etc.) of the substrate 102 and diverting, angling, or the like, at least a portion of the highly directional beam of ions 170 (hereinafter referred to highly directional angled beam of ions 170) prior to the highly directional angled beam of ions 170 colliding with the semiconductor IC device 100. The highly directional beam of ions 170 may be diverted by a faraday cage, tilting or angling the semiconductor IC device 100 holder (as depicted in FIG. 20).

The highly directional angled beam of ions 170 generally form the substantially angled gate cut opening 162 and/or the gate cut trench 161 within the one or more sacrificial gate(s) 136. From the gate cut opening 162 and/or the gate cut trench 161 within the one or more sacrificial gate cap(s) 138, the substantially angled gate cut opening 162 and/or the gate cut trench 161 within the one or more sacrificial gate(s) 136 may be angled toward to a particular active region. For example, as depicted in the Y cross-section view, the gate cut trench 161 within the one or more sacrificial gate(s) 136 may be substantially angled toward active region 1211, the gate cut opening 162 within the one or more sacrificial gate(s) 136 may be substantially angled toward active region $121_2$.

For clarity, the highly directional angled beam of ions 170 that can collide with semiconductor IC device 100 may be similarly angled, prior to colliding with semiconductor IC device 100. Consequently, one or more sidewalls of the angled gate cut opening(s) 162 and/or each of the angled gate cut trench(es) 161 within the one or more sacrificial gate(s) 136 may be substantially parallel, as depicted. For example, and as depicted in the Y cross-section, left sidewall(s) of gate cut trench(es) 161 may be substantially parallel to left sidewall(s) gate cut opening(s) 162.

For clarity, the angle of the etch may be chosen so that the well or bottom surface of the angled gate cut opening(s) 162 and/or the well or bottom surface of the angled gate cut trench(es) 161 within the one or more sacrificial gate(s) 136 land on the STI region 104 located between neighboring nanosheet stacks 120. For example, the angle of the etch may be chosen so that the gate cut trench(es) 161 within the one or more sacrificial gate(s) 136 are angled toward active region $121_1$ but land on STI region 104 that is located between active region $121_1$ and active region $121_2$, as opposed to landing on nanolayer stack 120 that is associated with active region $121_1$.

In an alternative implementation, as depicted in FIG. 20, the highly directional beam of ions 170 may angled relative to the semiconductor IC device 100 by angling semiconductor IC device 100 relative to the highly directional beam of ions 170. For example, a chuck that holds the semiconductor IC device 100 may be angled with respect to the highly directional beam of ions 170 so as to form the gate cut opening 162 and/or the gate cut trench 161 within the one or more sacrificial gate(s) 136 with substantially parallel sidewalls that are substantially angled relative to the major surface of the substrate 102.

Figure 9:
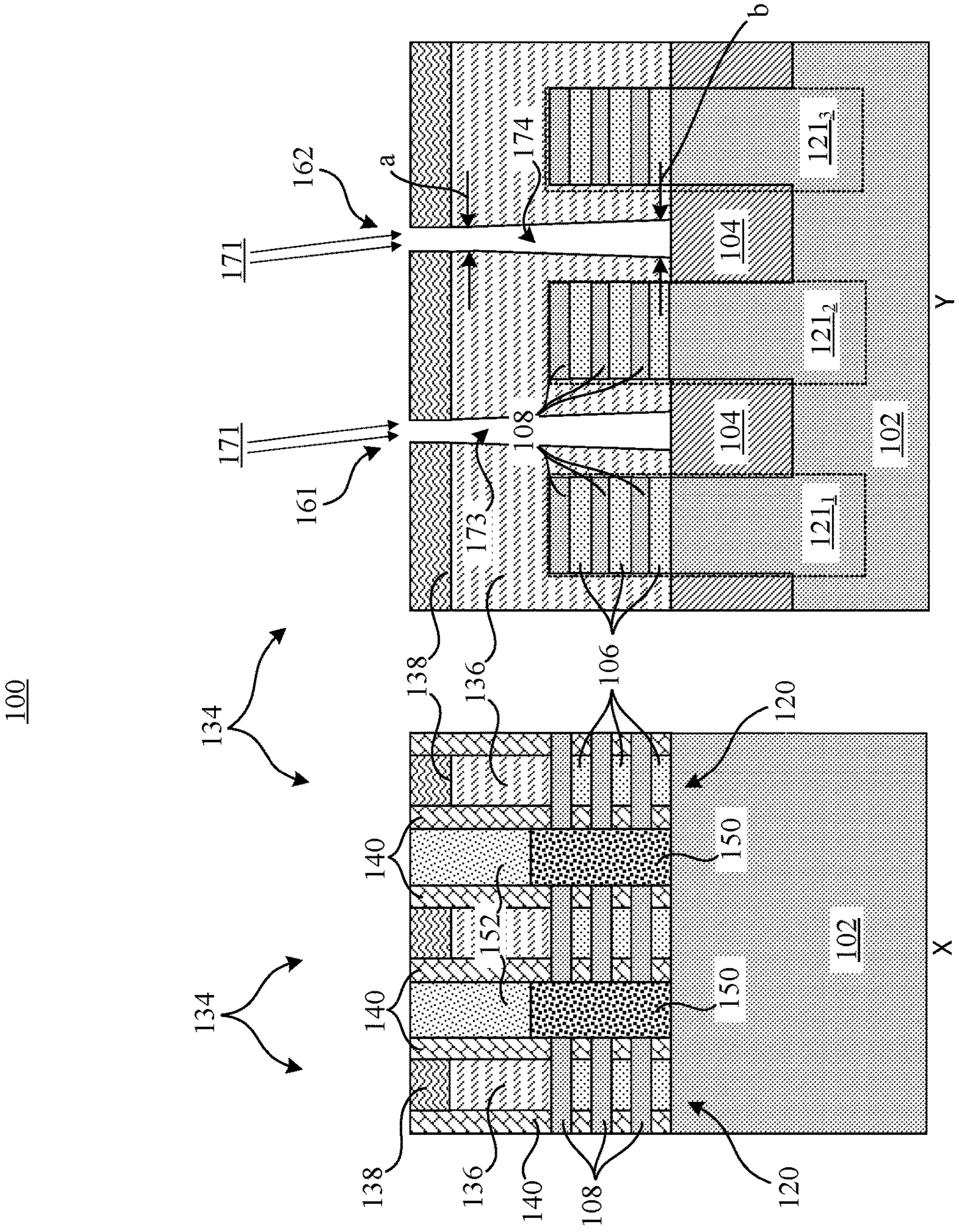

FIG. 9 depicts cross-sectional views of semiconductor IC device 100 shown after representative fabrication operation(s), in accordance with one or more embodiments. In the depicted fabrication stage, using the gate cut mask 160, the gate cut opening 162 and/or the gate cut trench 161 within the sacrificial gate 136 is etched in a second etch stage, by a highly directional beam of ions 171 that are angled relative to the semiconductor IC device 100, into the sacrificial gate 136.

Whereas the angle of the first etch stage, depicted in FIG. 8, forms gate cut opening 162 and/or the gate cut trench 161 within the sacrificial gate 136 that are angled generally toward a first active region 121, the angle of the second etch stage, depicted in FIG. 9, generally enlarges and angles the gate cut opening 162 and/or the gate cut trench 161 within the sacrificial gate 136 toward a particular second active region 121 that neighbors the first active region 121. For example, in the second etch stage, as depicted in the Y cross-section view, the gate cut trench 161 within the one or more sacrificial gate(s) 136 may be enlarged (i.e., volume of the gate cut trench 161 is increased) by the second etch that is substantially angled toward active region $\mathbf{121}_2$, the gate cut opening 162 within the one or more sacrificial gate(s) 136 may be enlarged (i.e., volume of the gate cut opening 162 is increased) by the second etch that is substantially angled toward active region $\mathbf{121}_3$. The second etch of the gate cut opening 162 and/or the gate cut trench 161 within the sacrificial gate 136 may generally stop at the STI region 104 between neighboring nanosheet stacks 120, otherwise expose the STI region 104 thereunder, or the like.

The angle of highly directional beam of ions 170 generally opposes the angle of highly directional beam of ions 171 from the direction normal and towards the major surface of the substrate 102. For example, if the angle of the highly directional angled beam of ions 170 is 10° clockwise from the direction normal to the major surface of the substrate 102, the angle of the highly directional angled beam of ions 171 is angled counterclockwise from the direction normal to the major surface of the substrate 102 (e.g., 100 counterclockwise, etc.).

In certain embodiments, the sacrificial gate cap(s) 138 is adapted to function as a sacrificial masking layer that, in conjunction with the ion base etch (e.g., RIE, or the like) of the sacrificial gate 136, defines the areal dimensions of the gate cut opening 162 and/or the gate cut trench 161 within the sacrificial gate(s) 136. After the second etch stage, the gate cut opening 162 and/or the gate cut trench 161 within the one or more sacrificial gate(s) 136 may have areal dimensions (length and width) that independently range from 20 to 80 nm, including ranges between any of the foregoing values, although lesser and greater dimensions may be used. Due to the opposing angled etch stages, a smaller length and/or width at the top of the gate cut opening 162 and/or the gate cut trench 161 (e.g., dimension a) is resultantly achieved relative to the length and width at the bottom of the gate cut opening 162 and/or the gate cut trench 161 (e.g., dimension b).

The highly directional beam of ions 171 may be angled relative to the semiconductor IC device 100 by angling ions 171 that initially travel toward the semiconductor IC device 100 in the direction normal to the major surface of the substrate 102 but are diverted or angled, or the like, prior to the ions 171 colliding with the semiconductor IC device 100. The opposing nature of angled ions 171, relative to the ions 170 of the first etch stage, generally enlarge gate cut opening 162 and/or the gate cut trench 161 within the one or more sacrificial gate(s) 136.

For clarity, each of the highly directional beam of ions 171 that can collide with semiconductor IC device 100 may be similarly angled, prior to colliding with semiconductor IC device 100. Consequently, one or more sidewalls of the angled gate cut opening(s) 162 and/or each of the angled gate cut trench(es) 161 within the one or more sacrificial gate(s) 136 may be substantially parallel, as depicted. For example, and as depicted in the Y cross-section, right sidewall(s) of gate cut trench(es) 161 may be substantially parallel to right sidewall(s) gate cut opening(s) 162.

For clarity, the angled of the etch may be chosen so that the well or bottom surface of the angled gate cut opening(s) 162 and/or the well or bottom surface of the angled gate cut trench(es) 161 within the one or more sacrificial gate(s) 136 still land on STI region 104 located between neighboring nanosheet stacks 120. For example, the angle of the etch may be chosen so that the gate cut trench(es) 161 within the one or more sacrificial gate(s) 136 are angled toward active region $\mathbf{121}_2$ but land on STI region 104 that is located between active region $\mathbf{121}_1$ and active region $\mathbf{121}_2$, as opposed to landing on nanolayer stack 120 that is associated with active region $\mathbf{121}_2$.

Figure 21:
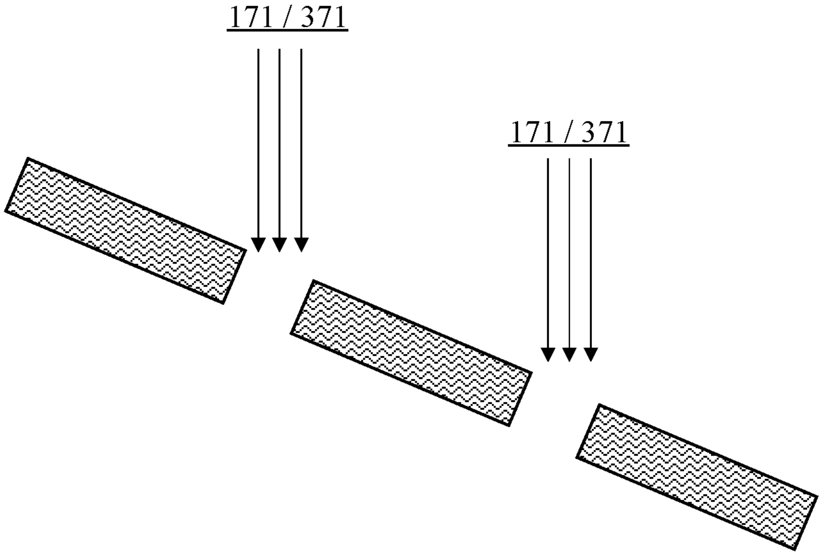

In an alternative implementation, as depicted in FIG. 21, the highly directional beam of ions 171 may be angled relative to the semiconductor IC device 100 by angling semiconductor IC device 100 relative to the highly directional beam of ions 171. For example, a chuck that holds the semiconductor IC device 100 may be angled with respect to the highly directional beam of ions 171 so as to enlarge the gate cut opening 162 and/or the gate cut trench 161 within the one or more sacrificial gate(s) 136.

For clarity, the gate cut opening 162 and/or the gate cut trench 161 within the one or more sacrificial gate(s) 136 may be referred herein as the inverted gate cut opening 162 and/or the inverted gate cut trench 161, due to the opposing angled etch stages and resulting smaller length and/or width at the top (e.g., dimension a) thereof, relative to the length and/or width at the bottom (e.g., dimension b). The resulting inverted trapezoidal cross sectional perimeter, as depicted in the Y view, of the inverted gate cut opening 162 and/or the inverted gate cut trench 161 may be constant from the gate spacer 140 on one side of the sacrificial gate 136 to the gate spacer 140 on the other side of the sacrificial gate 136 and may be generally orthogonal to the sacrificial gate 136 (e.g., 90 degrees across the sacrificial gate 136, parallel to the depicted X view plane, etc.).

Figure 10:
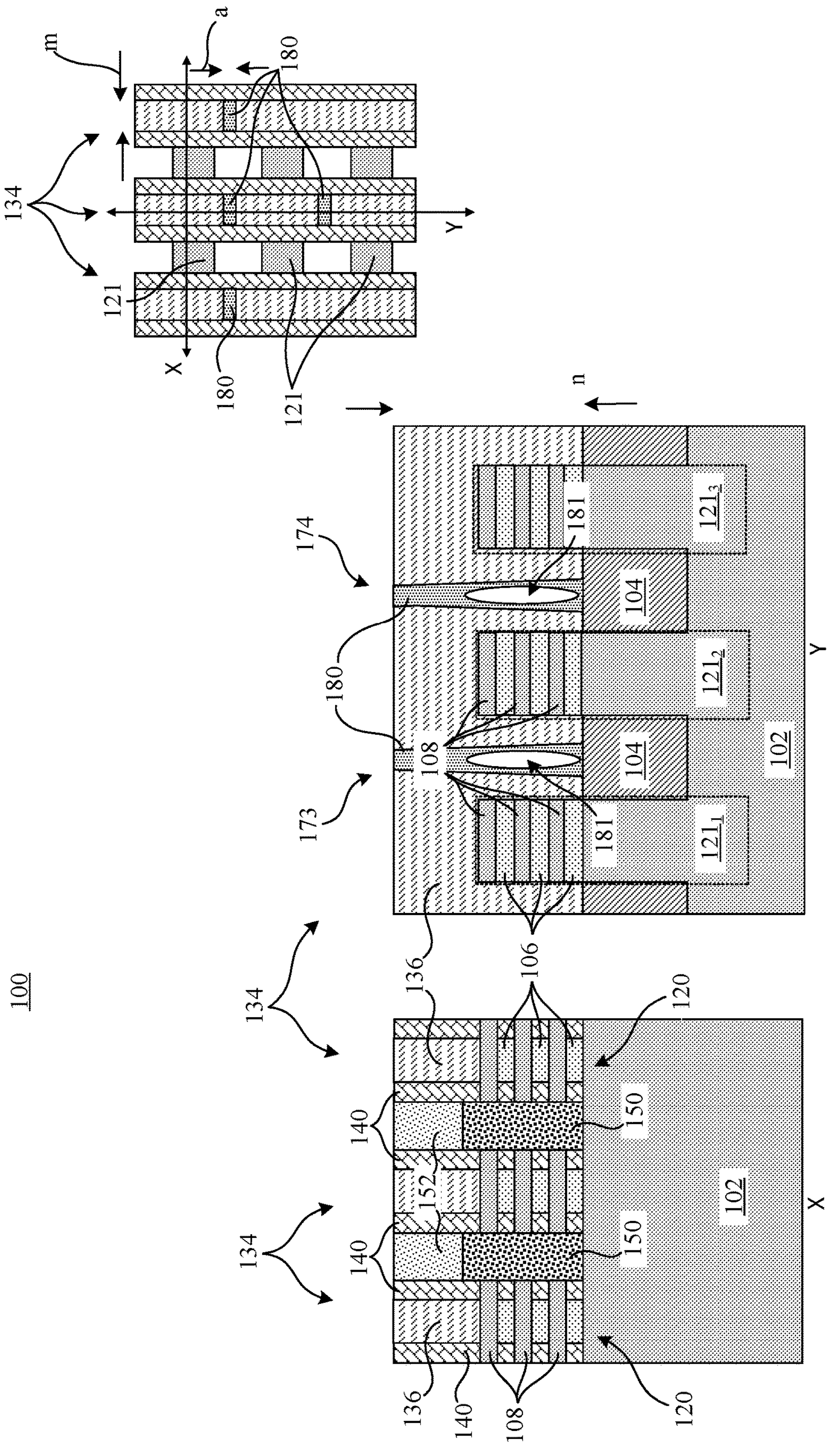

FIG. 10 depicts cross-sectional views of semiconductor IC device 100 shown after representative fabrication operation(s), in accordance with one or more embodiments. In the depicted fabrication stage, a gate cut region 180 is formed within the inverted gate cut opening 162 and/or the inverted gate cut trench 161 and an air pocket 181 may be formed within the gate cut region 180 in the inverted gate cut opening 162 and/or the inverted gate cut trench 161.

Air pocket 181 may be a material void or airgap and is present gate cut region 180. The air pocket 181 may reduce the parasitic capacitance between gate structures, relative to the gate cut region 180 without the air pocket 181.

In some embodiments, the air pocket 181 results from a deposition process of a gate cut dielectric layer in combination with a predefined relationship between a top areal of the inverted gate cut opening 162 and/or the inverted gate cut trench 161 at the top of the sacrificial gate(s) 136 (e.g., dimension a by dimension m) versus the thickness of the sacrificial gate(s) 136 (e.g., dimension n). For example, when the top areal area is sufficiently small compared to the thickness of the sacrificial gate(s) 136, the material of the gate cut dielectric layer that accumulates on the sides of the inverted gate cut opening 162 and/or the inverted gate cut trench 161 more quickly than on the adjacent surfaces, enabling the material of the gate cut dielectric layer to build up and close on itself at the respective top of the inverted gate cut opening 162 and/or the inverted gate cut trench 161.

In this way, the gate cut dielectric material may fail to occupy a respective internal region of the inverted gate cut opening 162 and/or the inverted gate cut trench 161. As such, air pocket 181 may be encapsulated by the gate cut dielectric material that is located between adjacent gate structures. In some embodiments, the horizontal width of the air pocket 181 (e.g., as shown in the Y-view) is less than the vertical height of the air pocket, as depicted.

Different instances of air pocket 181 can have relative differences in shape, size, location, or the like, because of manufacturing tolerance effects and/or to independently improve or optimize parasitic capacitance decreases between adjacent gate structures.

For clarity, while referred to as an "air pocket" in this description, the air pocket 181 may contain gases different from those commonly associated with air and its composition. As such, air pocket 181 can also be referred to as a void, a gas bubble, or other terminology. Also, the void or air pocket 181 can be distinguished from small imperfections that may be randomly positioned throughout a material, the void or air pocket 181 based on having a significantly greater size and being aligned within a gate cut region. For example, the void or air pocket 181 has a cross-sectional size of at least 1 nm wide by 2 nm tall in some embodiments. In other embodiments, the air pocket 181 has a horizontal dimension of at least half that of the associated vertical dimension. Further, while illustrated in the Y-view, as having an oval cross-sectional shape, such shape may not represent the actual shape and the void or air pocket 181 can have other cross-sectional shapes, including round, rectangular with rounded corners, trapezoidal, rectangular, and irregular shapes.

The gate cut dielectric layer may be formed by depositing a dielectric material, such as, for example, porous silicates, carbon doped oxides, silicon dioxides, silicon nitrides, silicon oxynitrides, or other dielectric materials. Any appropriate deposition technique for forming the gate cut dielectric layer can be utilized. The gate cut dielectric layer can be formed using, for example, CVD, PECVD, ALD, flowable CVD, spin-on dielectrics, or PVD.

In an embodiment, gate cut dielectric layer may be formed within the inverted gate cut opening 162 and/or within the inverted gate cut trench 161, upon the ILD 152, upon the gate spacers 140, and upon the one or more sacrificial gate structure(s) 134 to a thickness above the sacrificial gate structures 134 and subsequently planarized by a subtractive removal technique, such as a CMP. This subtractive removal technique may further remove the sacrificial gate cap(s) 138 and may expose the sacrificial gate(s) 136 within the sacrificial gate structure(s) 134. Generally, the gate cut dielectric layer material that remains or is within the inverted gate cut opening 162 and/or remains or is within the inverted gate cut trench 161 forms the gate cut region 180. As such, the respective top surfaces of the sacrificial gate(s) 136, gate spacers 140, ILD 152, and gate cut region 180 instances may be coplanar.

Figure 11:
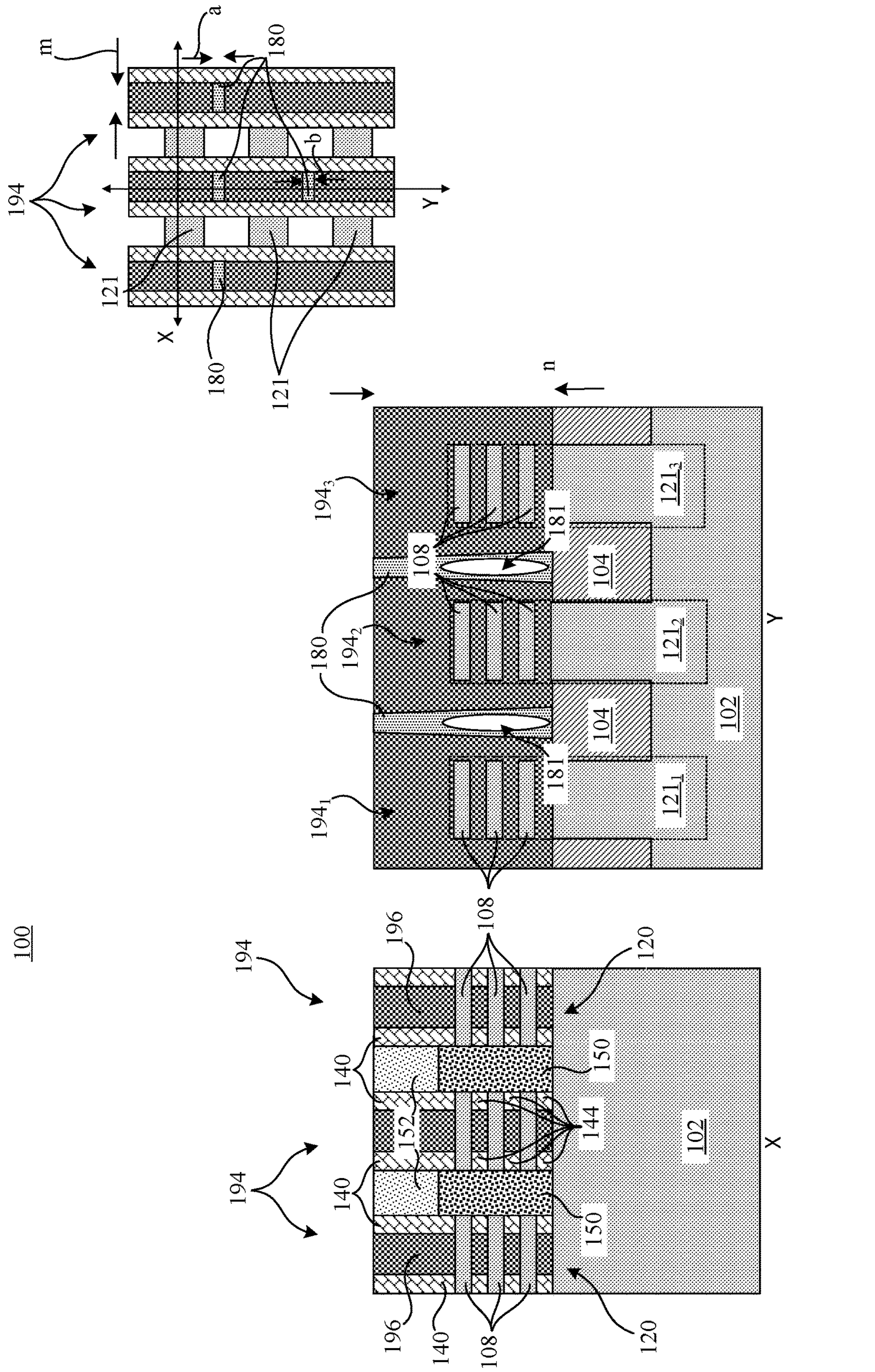

FIG. 11 depicts cross-sectional views of semiconductor IC device 100 shown after representative fabrication operation(s), in accordance with one or more embodiments. In the depicted fabrication stage, the sacrificial gate structures 134 and the sacrificial nanolayers 106 are removed. Further in the depicted fabrication stage, replacement gate structures 194 are formed.

The one or more sacrificial gate structures 134 may be removed by removing respective sacrificial gates 136, sacrificial gate oxide (if present), and the sacrificial nanolayers 106 associated therewith by a subtractive removal technique, such as one or more etches. For example, removal of these features may be accomplished by an etching process which may include a dry etching process such as RIE, plasma etching, ion etching or laser ablation. The etching can further include a wet chemical etching process(es).

After the removal of sacrificial nanolayers 106, void spaces exist between the vertically neighboring semiconductor nanolayers 108. It should be appreciated that during the removal of the sacrificial gate 136, the sacrificial oxide layer, the sacrificial nanolayers 106, and/or the like, etchant(s) may be used that do not significantly remove material of active semiconductor nanolayers 108, substrate 102, inner spacers 144, gate spacers 140, or the like. Upon removal of the sacrificial nanolayers 106 between the nanolayers 108, the remaining nanolayers 108 are arranged in a vertical stack. These vertically arranged nanolayers 108 may be utilized as channels of a transistor. Because these channels are vertically arranged, device scaling can be achieved.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

The replacement gate structures 194 may be formed by initially forming an interfacial layer (not shown) on the STI regions 104, upon the interior surfaces of the gate spacers 140, on the interior surfaces of the active nanolayers 108, on the interior surfaces of inner gate spacers 140, or the like. A high-κlayer (not shown) may be formed to cover the surfaces of exposed surfaces of the interfacial layer. The high-κlayer can be deposited by any suitable techniques, such as ALD, CVD, metal-organic CVD (MOCVD), physical vapor deposition (PVD), thermal oxidation, combinations thereof, or other suitable techniques. A high-κmaterial is a material with a higher dielectric constant than that of $SiO_2$, and can include e.g., LaO, AlO, ZrO, TiO, Ta2O5, Y2O3, SrTiO3(STO), BaTiO3 (BTO), BaZrO, HfZrO, HfLaO, HfSiO, LaSiO, AlSiO, HfTaO, HfTiO, BaSrTiO3 (BST), Al2O3, Si3N4, oxynitrides (SiON), or other suitable materials. The high-κlayer can include a single layer or multiple layers, such as metal layer, liner layer, wetting layer, and adhesion layer. In other embodiments, the high-κlayer can include, e.g., Ti, Ag, Al, TiAlN, TaC, TaCN, TaSiN, Mn, Zr, TiN, TaN, Ru, Mo, Al, WN, Cu, W, or any suitable materials.

The one or more replacement gate structures 194 may be further formed by depositing a work function (WF) gate (not shown) upon the high-κlayer. The WF gate can be comprised of metals, such as, e.g., copper (Cu), cobalt (Co), aluminum (Al), platinum (Pt), gold (Au), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the work function (WF) gate sets the threshold voltage (Vt) of the transistors within the active regions 121. The high-κlayer may be between and separate the WF gate from the active nanolayers 108. The WF gate may be formed to a thickness to generally fill the gaps or voids between active nanolayers 108.

The one or more replacement gate structures 194 may be further formed by depositing a conductive fill gate 196 upon the WF gate. The conductive fill gate 196 can be comprised of metals, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 194 formation, the top surface of the semiconductor IC device 100 may be planarized by a planarization technique such as a CMP, mechanical grinding process, or the like. After the planarization technique, respective top surfaces of the ILD 152, gate spacers 140, replacement gate structure(s) 194, gate cut region 180 instances, may be horizontally coplanar.

Generally, the gate cut region 180 separates adjacent and inline replacement gate structure(s) 194. For example, gate cut region 180 instances separate adjacent replacement gate structure(s) 194$_1$, 194$_2$, and 194$_3$ that are inline between the same gate spacer(s) 140. The air pocket 181 may reduce the parasitic capacitance between adjacent gate structures. For example, the air pocket 181 within the gate cut region 180 instances that separate adjacent replacement gate structure(s) 194$_1$, 194$_2$, and 194$_3$ may relatively reduce the parasitic capacitance between the replacement gate structure(s) 194$_1$, 194$_2$, and 194$_3$ compared to a gate cut dielectric instances with no air pocket. Reduction of such parasitic capacitance(s) may improve performance of the semiconductor IC device 100 and may allow for further semiconductor IC device scaling.

Figure 12:
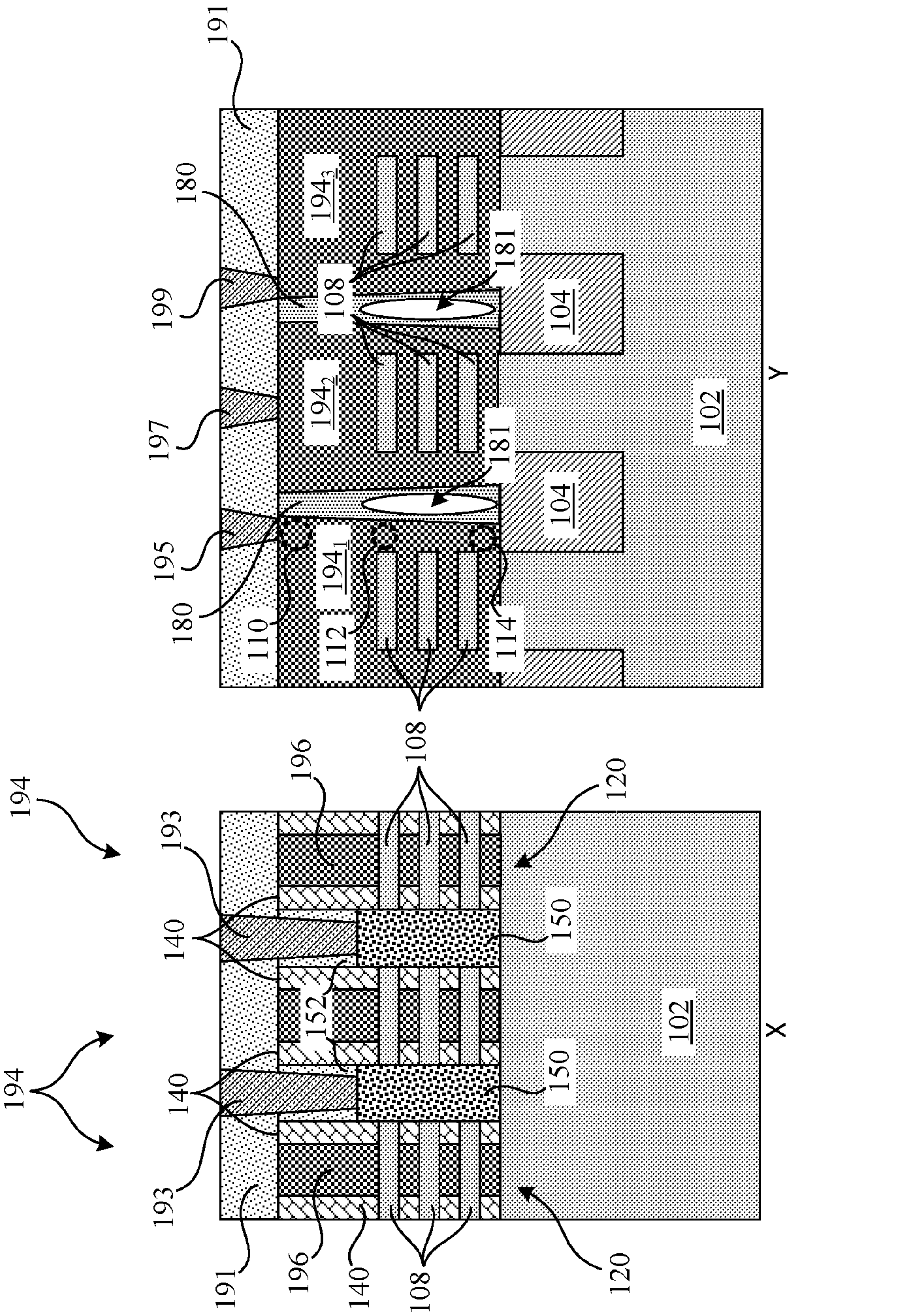

FIG. 12 depicts cross-sectional views of semiconductor IC device 100 shown after representative fabrication operation(s), in accordance with one or more embodiments. In the depicted fabrication stage, ILD 191 is formed. Further in the depicted fabrication stage, one or more frontside contacts 193, 195, 197, and 199 are formed.

ILD 191 may be formed upon one or more replacement gate structures 194, upon the gate spacer(s) 140, upon ILD 152, upon the gate cut region 180 instances, or the like. The ILD 191 can be any suitable dielectric material, such as, for example, porous silicates, carbon doped oxides, silicon dioxides, silicon nitrides, silicon oxynitrides, or other dielectric materials. The ILD 191 can be formed using, for example, CVD, PECVD, ALD, flowable CVD, spin-on dielectrics, or PVD.

The one or more frontside contacts may formed in predetermined or desired locations where a frontside contact is desirable to contact an underlying structure, such as a S/D region 150, replacement gate structure 194, or the like. For instance, in one example, frontside contact 193 may be formed to meld or connect with the underlying S/D region 150. In another example, a frontside contact 195 may be formed to meld or connect with the underlying replacement gate structure 194$_1$, a frontside contact 197 may be formed to meld or connect with the underlying replacement gate structure 194$_2$, and/or a frontside contact 199 may be formed to meld or connect with the underlying replacement gate structure 194$_3$.

The frontside contacts may be formed by initially forming frontside contact openings within ILD 191, within ILD 152, as appropriate depending upon the location or type of the frontside contact to be formed. The formation of the frontside contact openings may include one or more etches to remove the applicable ILD material(s) to expose respective portions of the S/D regions 150 and respective portions of replacement gate structures 194$_1$, 194$_2$, and/or 194$_3$.

Frontside contacts 193, 195, 197, and/or 199 may be formed by depositing conductive material within the frontside contact openings. The formation of the frontside contacts 193, 195, 197, and/or 199 may include forming a blanket conductive barrier layer extending into the frontside contact openings, depositing a metal or conductive material over the blanket conductive barrier layer, and performing a planarization process, such as a CMP process or a mechanical grinding process, to remove excess portions of the conductive barrier layer and the conductive material. Frontside contacts 193, 195, 197, and/or 199 may consist of a liner formed of Ni, NiPt, Ti, TiN, TaN, etc. and a conductive fill thereupon, such as Al, Ru, W, Co, Cu, etc. In some implementations, the formation of frontside contacts 193, 195, 197, and/or 199 may be a part of middle of the line (MOL) fabrication processes.

The frontside contacts 193, 195, 197, and/or 199 may be connected to a power rail or a signal line within a frontside back end of the line (BEOL) network. The power rail may provide power potential (VDD, VSS, or the like) to the structure associated with the frontside contact (e.g., S/D region 150, replacement gate structure 194, etc.). A power rail is defined herein as a conductive feature, such as a wire, trace, plane, or the like, that is configured to electrically carry a logical electrical potential that does not change over a steady state period.

The frontside contacts 193, 195, 197, and/or 199 may be connected to a signal line within the frontside BEOL network and electrically carry a functional or logical potential or signal that is to change or is otherwise dynamic within the steady state period. The power rail potential and the signal line potential may determine whether the associated transistor is on or off.

The inverted gate cut region(s) 180 result in a top surface area of the replacement gate structure 194 that is relatively larger than the bottom surface area of replacement gate structure 194. As the top surface of replacement gate structure 194 is typically a landing area for a frontside gate contact, the inverted gate cut region(s) 180 may increase the landing area to a respective frontside gate contact. Because of the increased landing area, there is an increased propensity of the frontside gate contact to contact or meld with to the underling replacement gate structure 194, as depicted. For example, there is a relatively increased volume of replacement gate structure 194, depicted by region 110 thereof. This increased landing area of replacement gate structure 194 further enables a frontside contact to be placed in further outward locations associated with the region 110, which may reduce routing complexities in certain instances.

Further, the inverted gate cut regions 180 result in improved resistance characteristics through replacement gate structure 194. Specifically, the inverted gate cut regions 180 cause a relatively wide region 112, compared to the narrow region 40, depicted in FIG. 1, between the top active nanolayer (i.e., the top channel) and the gate cut region. The wide region 112 provides an advantageously relatively lower electrical resistance therethrough, compared to the narrow region 40. Similarly, the inverted gate cut regions 180 cause a bottom perimeter region 114 with relatively less conductive material, relative to the bottom perimeter region 42, depicted in FIG. 1, nearest the replacement gate structure 194 bottom surface perimeter edge. This decrease in conductive material advantageously and relatively reduces the parasitic capacitance of the semiconductor IC device 100.

Figure 13:
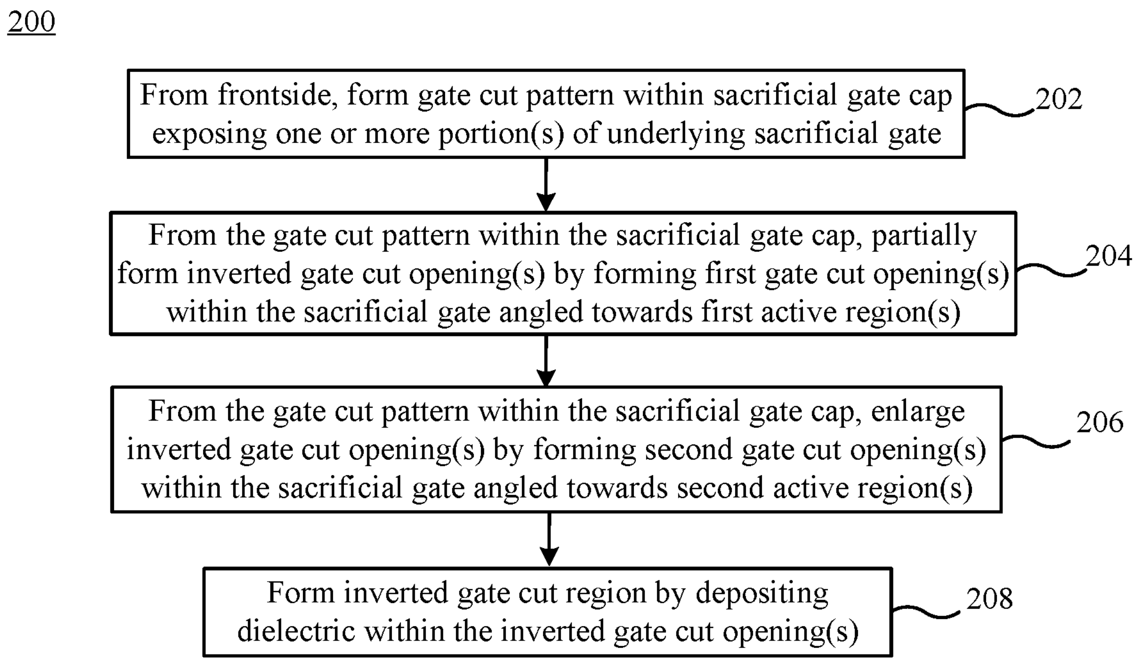
FIG. 13 depicts a flow diagram illustrating a semiconductor IC device fabrication method to fabricate a semiconductor IC device that includes a gate structure that is separated into distinct gate structures by an inverted gate cut region, in accordance with one or more embodiments of the disclosure.

FIG. 13 depicts a flow diagram illustrating method 200 to fabricate a semiconductor IC device, such as semiconductor IC device 100, that includes an inverted gate cut region fabricated with a gate last process, according to one or more embodiments of the present disclosure. The depicted fabrication operations of method 200 may be illustrated and described above with reference to one or more of FIG. 2 through FIG. 12 of the drawings. The method 200 depicted herein is representative, as there can be many variations to the diagram or operations described therein without departing from the spirit of the embodiments. For instance, the operations can be performed in a differing order, or operations can be added, deleted, or modified. For instance, method 200 may be described with reference to the fabrication of semiconductor IC device 100, though method 200 may be utilized to fabricate other semiconductor IC devices that include one or more inverted gate cut regions.

At block 202, method 200 includes, from the frontside of the semiconductor IC device, forming a gate cut pattern within a sacrificial gate cap that exposes one or more portion(s) of an underlying and associated sacrificial gate. For example, as depicted in FIG. 6, using the gate cut mask 160 and the spacer layer 164 as an etch mask, the gate cut opening 162 and/or the gate cut trench 161 is etched into the sacrificial gate cap 138.

At block 204, method 200 may continue with, from the gate cut pattern within the sacrificial gate cap, forming inverted gate cut opening(s) in a first etch stage by forming first gate cut opening(s) within the sacrificial gate that are angled towards respective first active region(s). For example, the gate cut opening 162 and/or the gate cut trench 161 is etched in the first etch stage, by a highly directional beam of ions 170 that are angled relative to the semiconductor IC device 100, into the sacrificial gate 136. In a particular implementation, the first etch stage forms the gate cut trench 161 angled toward active region $\mathbf{121_1}$ and forms the gate cut opening 162 angled toward active region $\mathbf{121_2}$.

At block 206, method 200 may continue with, from the gate cut pattern within the sacrificial gate cap, further forming the inverted gate cut opening(s) are with a second etch stage by forming second gate cut opening(s) within the sacrificial gate that are angled towards respective second active region(s). For example, the gate cut opening 162 and/or the gate cut trench 161 is enlarged by the second etch stage, by a highly directional beam of ions 171 that are angled relative to the semiconductor IC device 100, into the sacrificial gate 136. In a particular implementation, the second etch stage enlarges the gate cut trench 161 by the second gate cut opening(s) angled toward active region $\mathbf{121_2}$ and forms the gate cut opening 162 by the second gate cut opening(s) angled toward active region $\mathbf{121_3}$.

At block 208, method 200 may continue with forming one or more inverted gate cut region(s) by depositing a dielectric or electrically insulating material within the inverted gate cut opening(s). For example, inverted gate cut region 180 is formed within the inverted gate cut opening 162 and/or the inverted gate cut trench 161. Due to the inverted geometry of the inverted gate cut opening 162 and/or the inverted gate cut trench 161, air pocket 181 may be formed within the inverted gate cut region 180 due to the dielectric or electrically insulating material pinching off on itself at the top of the inverted gate cut opening 162 and/or the top of the inverted gate cut trench 163 prior to fully filling the inverted gate cut opening 162 and/or the inverted gate cut trench 161.

Figure 14:
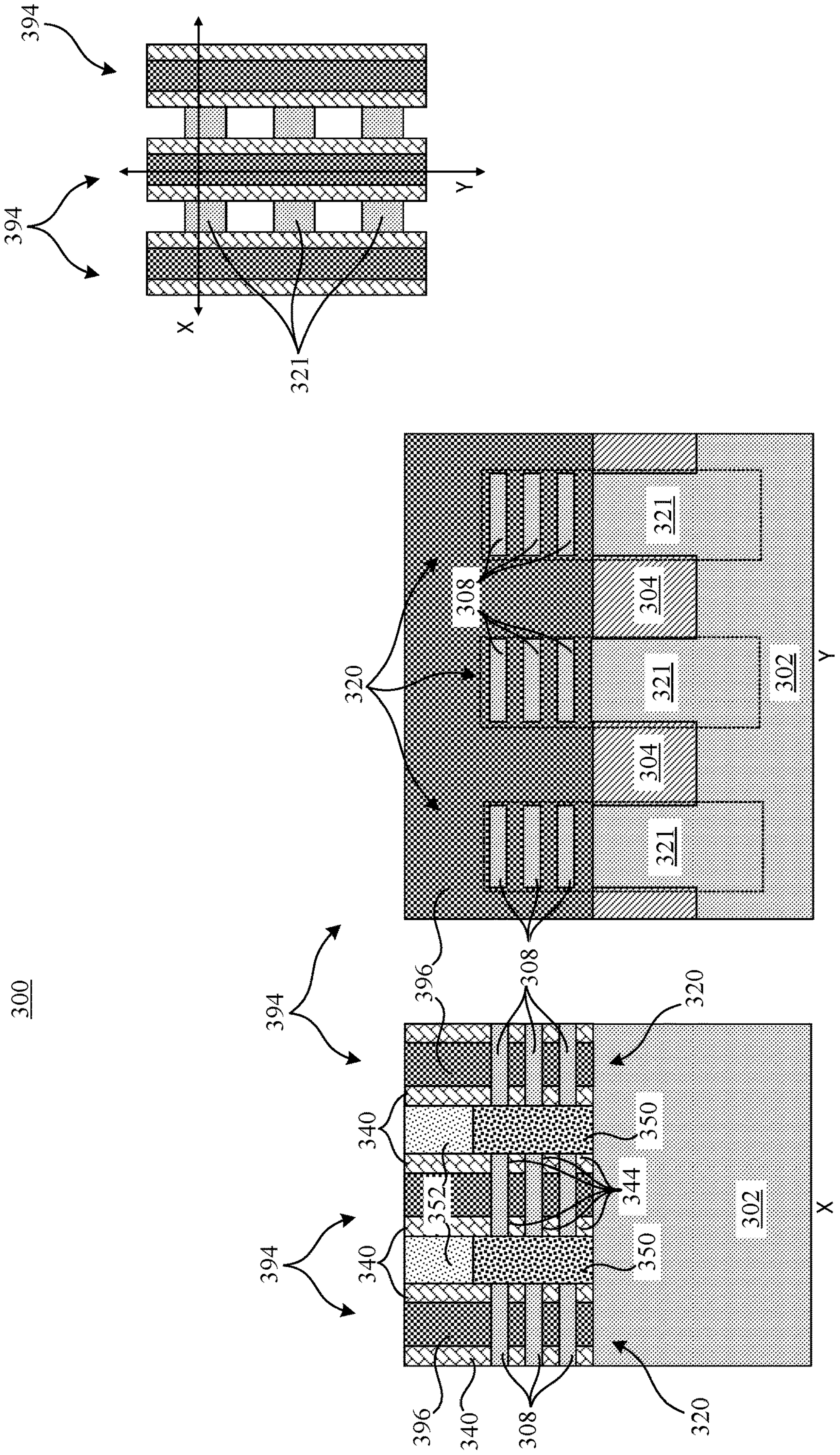
FIG. 14 through FIG. 18 depict fabrication stage views of a semiconductor IC device that includes a gate structure that is separated into distinct gate structures by an inverted gate cut region, in accordance with one or more embodiments of the disclosure.

FIG. 14 depicts cross-sectional views of semiconductor IC device 300 shown after initial fabrication operation(s), in accordance with one or more embodiments. In these initial fabrication stages, nanolayers are formed upon a substrate 302, one or more nanolayer stacks 320 are patterned from the nanolayers, STI regions 304 are formed, one or more sacrificial gate structures are formed, gate spacers 340 are formed upon the side(s) of the one or more sacrificial gate structures, the one or more nanolayer stacks are recessed, the sacrificial nanolayers underneath the gate spacers 340 are indented, inner spacers 344 are formed within the indents, one or more source/drain (S/D) regions 350 are formed, ILD 352 is formed, the one or more sacrificial gate structures are removed, the sacrificial nanolayers underneath the one or more sacrificial gate structures are removed, and one or more replacement gate structure(s) 394 are formed in place of the removed one or more sacrificial gate structures.

Substrate 302 may be the same or like substrate 102 and further details are not repeated herein. The nanolayers (e.g., active nanolayers 308 and the sacrificial nanolayers) may be similarly formed and may consist of similar materials relative to active nanolayers 108 and sacrificial nanolayers 106 and further details are not repeated herein. The one or more nanolayer stacks 320 may be similarly formed and may be the same or like the one or more nanolayer stacks 120 and further details are not repeated herein.

STI regions 304 may be similarly formed and may be the same or like STI regions 104 and further details are not repeated herein. The one or more STI regions 304 may have a volume that sufficiently electrically isolates components or features of neighboring transistors, or the like, and/or may sufficiently electrically isolates neighboring active regions 321.

The one or more sacrificial gate structures may be similarly formed and may consist of similar materials relative to sacrificial gate structures 134 and further details are not repeated herein. The one or more gate spacers 340 may be similarly formed and may consist of similar materials relative to one or more gate spacers 140 and further details are not repeated herein. The nanolayer stacks 320 may be patterned by forming one or more S/D recesses like the S/D recesses 149 and further details are not repeated herein.

The sacrificial nanolayers 306 within the nanolayer stacks 320 and that are underneath the gate spacer 340 may be indented, thereby forming an indent void, and a respective inner spacer 344 may be formed within an indent void. The one or more S/D regions 350 may be similarly formed and may consist of similar materials relative to one or more S/D regions 150 and further details are not repeated herein. The ILD 352 may be similarly formed and may consist of similar materials relative to ILD 152 and further details are not repeated herein.

The one or more sacrificial gate structures may be similarly removed relative to the removal of sacrificial gate structures 134 and further details are not repeated herein. Likewise, the sacrificial nanolayers may be similarly removed relative to the removal of sacrificial nanolayers 106 and further details are not repeated herein. The replacement gate structures 394 may be similarly formed and may consist of similar materials (e.g., conductive fill gate 396, etc.) relative to replacement gate structures 394 and further details are not repeated herein.

Figure 15:
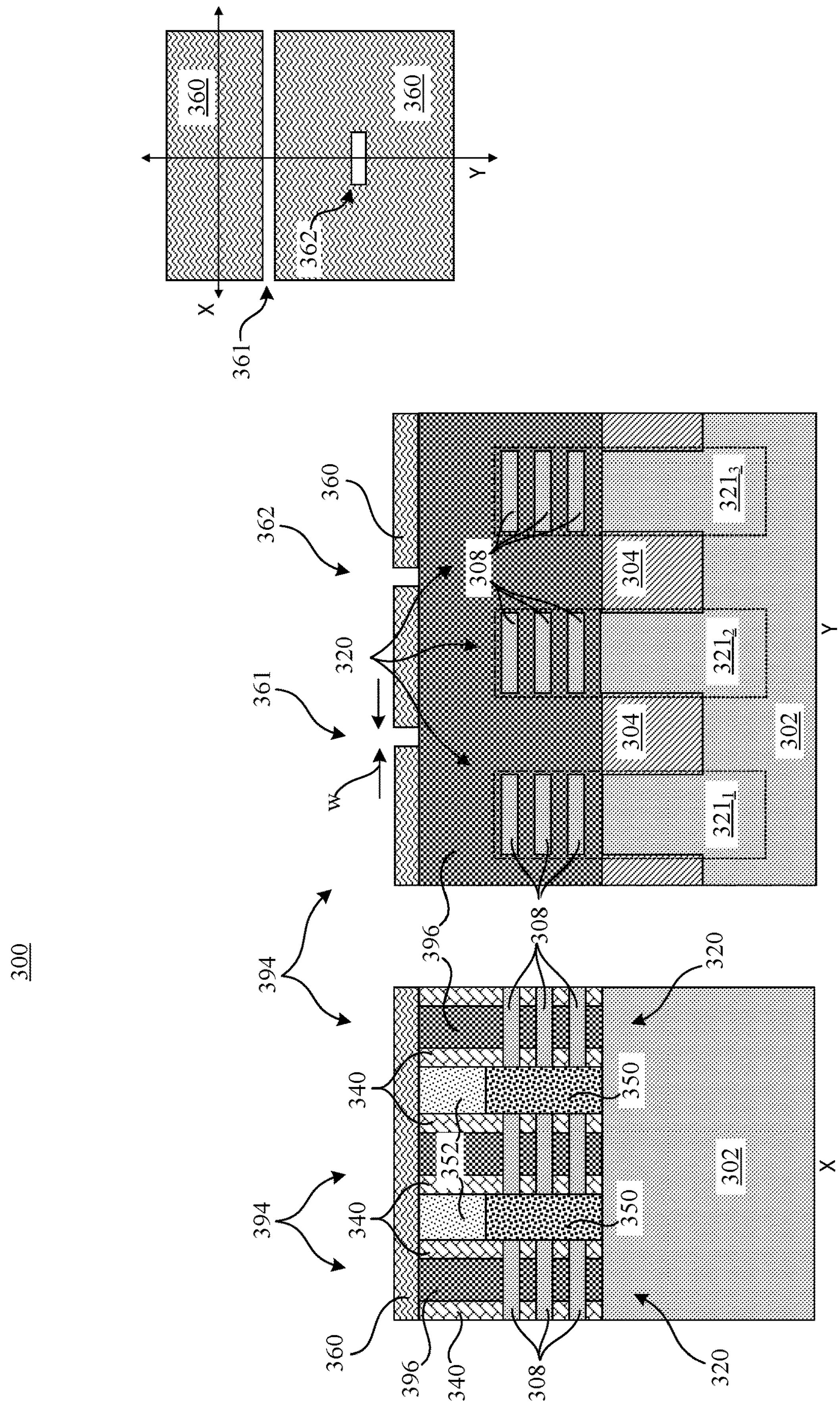

FIG. 15 depicts cross-sectional views of semiconductor IC device 300 shown after representative fabrication operation(s), in accordance with one or more embodiments. In the depicted fabrication stage, a gate cut mask 360 is formed and patterned to create a gate cut opening 362 over a single replacement gate structure 394 and/or a gate cut trench 361 over multiple replacement gate structure 394.

The gate cut mask 360 which may consist of a nitride material, such as, but not necessarily limited to, silicon nitride (SiN) or titanium nitride (TiN), a low temperature oxide, such as an organic planarization layer (OPL), may be formed on the replacement gate structure 394, on the ILD 352, on the gate spacers 340. The gate cut mask 360 can be deposited using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. In some embodiments, a planarization process, such as, chemical mechanical planarization (CMP) can be used to remove excess gate cut mask 360 material. A height of the gate cut mask 360 can be in the range of, but is not necessarily limited to, 20 nm to 100 nm.

Subsequently, a photoresist (not shown) may be formed over the gate cut mask 160. The photoresist may include a positive-tone photoresist composition, a negative-tone photoresist composition, or a hybrid-tone photoresist composition. A layer of photoresist material may be formed by a deposition process such as, for example, spin-on coating.

The deposited photoresist is subjected to a pattern of irradiation, and the exposed photoresist material is developed utilizing resist developer. The pattern provided by the patterned photoresist material is transferred through the gate cut mask 360 to form the gate cut opening 362 and/or the gate cut trench 361. According to various embodiments, the areal dimensions of the gate cut opening 362 and/or the gate cut trench 361 are within lithography process windows for forming such structures.

The pattern transfer etching process to form the gate cut opening 362 and/or the gate cut trench 361 may be an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

The etch of gate cut mask 360 defines the areal dimensions of the gate cut opening 362 and/or the gate cut trench 361 therewithin. The gate cut opening 362 and/or the gate cut trench 361 within the gate cut mask 360 may have areal dimensions (length and width) that independently range from 10 to 40 nm, e.g., 10, 15, 20, 25, 30, 35 or 40 nm, including ranges between any of the foregoing values, although lesser and greater dimensions may be used. As shown in the Y cross-section view, a lateral dimension (w) of the gate cut opening 362 and/or the gate cut trench 361 within the one or more gate cut masks 360, such that the gate cut opening 362 and/or the gate cut trench 361 within the gate cut mask 360 may be defined with substantially vertical sidewalls. In certain embodiments, the width (w) of the gate cut opening 362 and/or the gate cut trench 361 is less than 20 nm, e.g., 5, 10 or 15 nm.

During etching of the gate cut mask 360 to form the gate cut opening 362 and/or the gate cut trench 361 therein, the materials adjacent to the perimeter footprint of the gate cut opening 362 and/or the gate cut trench 361 is protected by the overlying gate cut mask 360.

For clarity, the gate cut opening 362 may be located vertically in the middle of active region 321$_2$ and active region 321$_3$. For example, a same vertical bisector may be shared by the gate cut opening 362, by active region 321$_2$, and by active region 321$_3$. Similarly, the gate cut trench 361 may be located vertically in the middle of active region 321$_1$ and active region 321$_2$. For example, a same vertical bisector may be shared by the gate cut trench 361, by active region 321$_1$, and by active region 321$_2$.

In an example, the gate cut opening 362 and/or the gate cut trench 361 is transferred into one or more replacement gate structures 394 and into the associated gate spacers 340. Consequently, the gate cut opening 362 and/or the gate cut trench 361 extends into the gate spacers 340 on either side of the one or more replacement gate structures 394.

Figure 16:
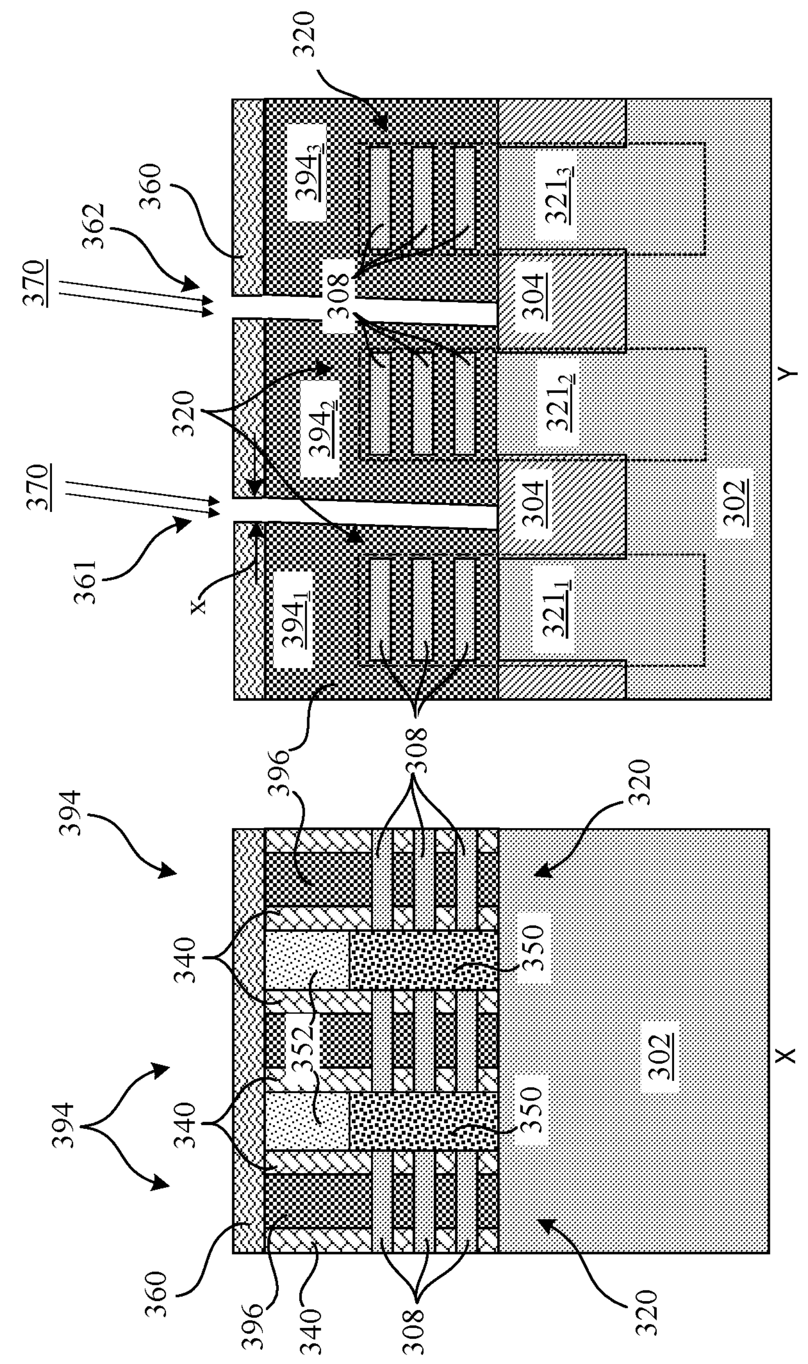

FIG. 16 depicts cross-sectional views of semiconductor IC device 300 shown after representative fabrication operation(s), in accordance with one or more embodiments. In the depicted fabrication stage, using the gate cut mask 360, the gate cut opening 362 and/or the gate cut trench 361 is etched in a first etch stage, by a highly directional beam of ions 370 that are angled relative to the semiconductor IC device 300, into the replacement gate structure(s) 394. The angled etch of the replacement gate structure(s) 394 may generally stop at the STI region 304 between neighboring nanosheet stacks 320 or otherwise expose the STI region 304 thereunder.

In certain embodiments, the gate cut mask 360 is adapted to function as a sacrificial masking layer that, in conjunction with the ion base etch (e.g., RIE, or the like) of replacement gate structure(s) 394, defines the areal dimensions of the gate cut opening 362 and/or the gate cut trench 361 within the replacement gate structure(s) 394. The gate cut opening 362 and/or the gate cut trench 361 within the one or more replacement gate structure(s) 394 may have areal dimensions (length and width) that independently range from 10 to 40 nm, e.g., 10, 15, 20, 25, 30, 35 or 40 nm, including ranges between any of the foregoing values, although lesser and greater dimensions may be used. As shown in the Y cross-section view, a wall to wall dimension (x) of the gate cut opening 362 and/or the gate cut trench 361 is defined by the associated gate cut opening 362 and/or the gate cut trench 361 within the gate cut mask 360, there above. As such, that the gate cut opening 362 and/or the gate cut trench 361 may be defined with substantially parallel sidewalls that are substantially angled relative to the major surface of the substrate 302. In certain embodiments, the width (x) of the gate cut opening 362 and/or the gate cut trench 361 within the one or more replacement gate structure(s) 394 is less than 20 nm, e.g., 5, 10 or 15 nm.

The highly directional beam of ions 370 may angled relative to the semiconductor IC device 300 by first directing the highly directional beam of ions 370 toward the semiconductor IC device 300 in the direction normal to the major surface (e.g., top surface, etc.) of the substrate 302 and diverting, angling, or the like, at least a portion of the highly directional beam of ions 370 (hereinafter referred to highly directional angled beam of ions 370) prior to the highly directional angled beam of ions 370 colliding with the semiconductor IC device 300. The highly directional beam of ions 370 may be diverted by the same or similar mechanisms relative to the highly directional beam of ions 170 and further details are not repeated herein.

The highly directional angled beam of ions 370 generally form the substantially angled gate cut opening 362 and/or the gate cut trench 361 within the one or more replacement gate structure(s) 394. From the gate cut opening 362 and/or the gate cut trench 361 within the one or more replacement gate structure(s) 394, the substantially angled gate cut opening 362 and/or the gate cut trench 361 within the one or more replacement gate structure(s) 394 may be angled toward to a particular active region 321. For example, as depicted in the Y cross-section view, the gate cut trench 361 within the one or more replacement gate structure(s) 394 may be substantially angled toward active region 321$_1$, the gate cut opening 362 within the one or more replacement gate structure(s) 394 may be substantially angled toward active region 321$_2$.

For clarity, each of the highly directional angled beam of ions 370 that can collide with semiconductor IC device 300 may be similarly angled, prior to colliding with semiconductor IC device 300. Consequently, one or more sidewalls of the angled gate cut opening(s) 362 and/or each of the angled gate cut trench(es) 361 within the one or more replacement gate structure(s) 394 may be substantially parallel, as depicted. For example, and as depicted in the Y cross-section, left sidewall(s) of gate cut trench(es) 361 may be substantially parallel to left sidewall(s) gate cut opening(s) 362.

For clarity, the angle of the etch may be chosen so that the well or bottom surface of the angled gate cut opening(s) 362 and/or the well or bottom surface of the angled gate cut trench(es) 361 within the one or more replacement gate structure(s) 394 land on the STI region 304 located between neighboring nanosheet stacks 320. For example, the angle of the etch may be chosen so that the gate cut trench(es) 361 within the one or more replacement gate structure(s) 394 are angled toward active region $\mathbf{321_1}$ but land on STI region 304 that is located between active region $\mathbf{321_1}$ and active region $\mathbf{321_2}$, as opposed to landing on nanolayer stack 320 that is associated with active region $\mathbf{321_1}$, for example.

In an alternative implementation, as depicted in FIG. 20, the highly directional beam of ions 370 may angled relative to the semiconductor IC device 300 by angling semiconductor IC device 300 relative to the highly directional beam of ions 370. For example, a chuck that holds the semiconductor IC device 300 may be angled with respect to the highly directional beam of ions 370 to form the gate cut opening 362 and/or the gate cut trench 361 within the one or more replacement gate structure(s) 394 with substantially parallel sidewalls that are substantially angled relative to the major surface of the substrate 302.

Figure 17:
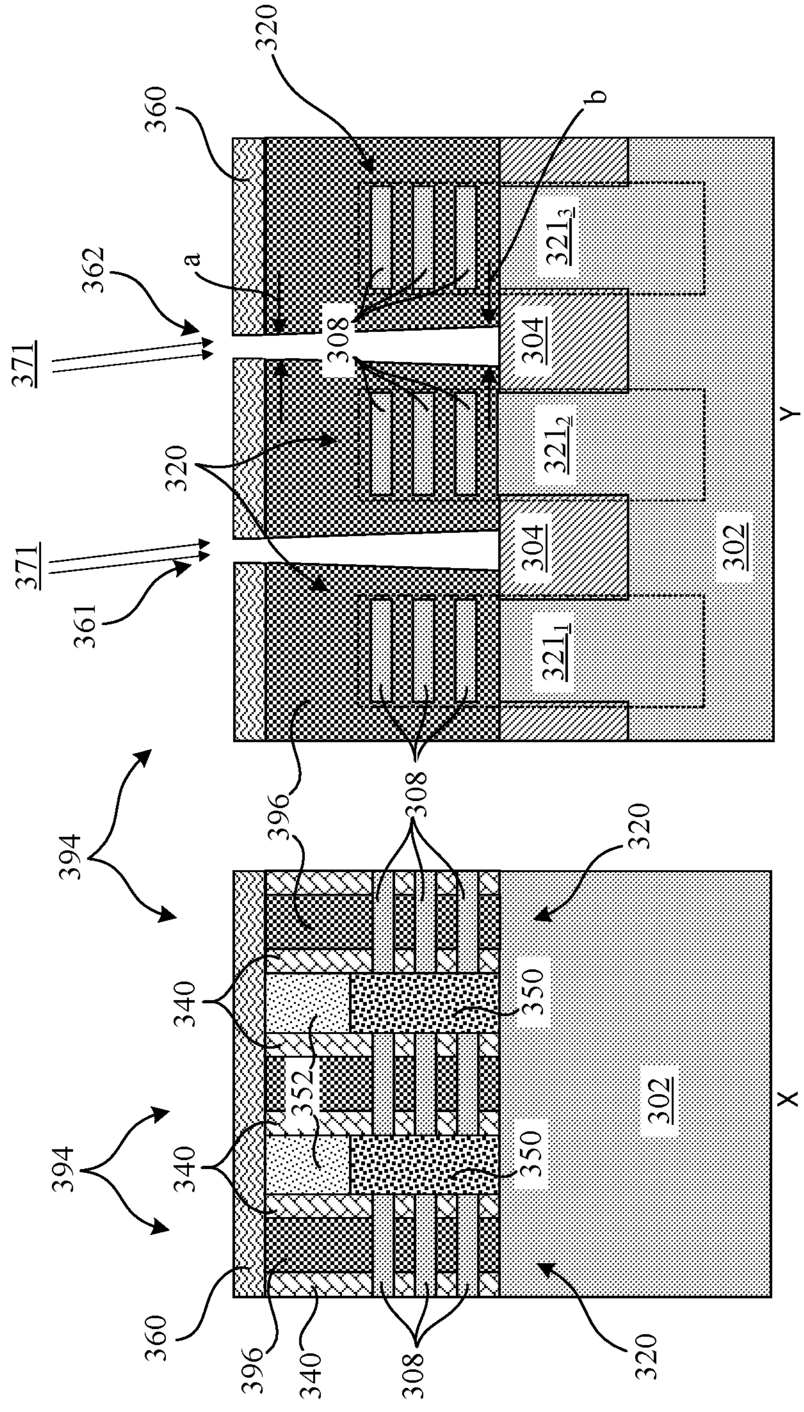

FIG. 17 depicts cross-sectional views of semiconductor IC device 300 shown after representative fabrication operation(s), in accordance with one or more embodiments. In the depicted fabrication stage, using the gate cut mask 360, the gate cut opening 362 and/or the gate cut trench 361 within the sacrificial gate 336 is etched in a second etch stage, by a highly directional beam of ions 371 that are angled relative to the semiconductor IC device 300, into the replacement gate structure(s) 394.

Whereas the angle of the first etch stage, depicted in FIG. 16, forms gate cut opening 362 and/or the gate cut trench 361 within the replacement gate structure(s) 394 that are angled generally toward a first active region 121, the angle of the second etch stage, depicted in FIG. 17, generally enlarges and angles the gate cut opening 362 and/or the gate cut trench 361 within the replacement gate structure(s) 394 toward a particular second active region 321 that neighbors the first active region 321. For example, in the second etch stage, as depicted in the Y cross-section view, the gate cut trench 361 within the one or more replacement gate structure(s) 394 may be enlarged (i.e., volume of the gate cut trench 361 is increased) by the second etch that is substantially angled toward active region $\mathbf{321_2}$, the gate cut opening 362 within the one or more replacement gate structure(s) 394 may be enlarged (i.e., volume of the gate cut opening 362 is increased) by the second etch that is substantially angled toward active region $\mathbf{321_3}$. The second etch of the gate cut opening 362 and/or the gate cut trench 361 within the replacement gate structure(s) 394 may generally stop at the STI region 304 between neighboring nanosheet stacks 320, otherwise expose the STI region 304 thereunder, or the like.

The angle of highly directional beam of ions 370 generally opposes the angle of highly directional beam of ions 371 from the direction normal and towards the major surface of the substrate 302. For example, if the angle of the highly directional angled beam of ions 370 is 100 clockwise from the direction normal to the major surface of the substrate 302, the angle of the highly directional angled beam of ions 371 is angled counterclockwise from the direction normal to the major surface of the substrate 302 (e.g., 100 counterclockwise, etc.).

In certain embodiments, the gate cut mask 360 is adapted to function as a sacrificial masking layer that, in conjunction with the ion base etch (e.g., RIE, or the like) of the replacement gate structure(s) 394, defines the areal dimensions of the gate cut opening 362 and/or the gate cut trench 361 within the replacement gate structure(s) 394. After the second etch stage, the gate cut opening 362 and/or the gate cut trench 361 within the one or more replacement gate structure(s) 394 may have areal dimensions (length and width) that independently range from 20 to 80 nm, including ranges between any of the foregoing values, although lesser and greater dimensions may be used. Due to the opposing angled etch stages, a smaller length and/or width at the top of the gate cut opening 362 and/or the gate cut trench 361 (e.g., dimension a) is resultantly achieved relative to the length and/or width at the bottom of the gate cut opening 362 and/or the gate cut trench 361 (e.g., dimension b).

The highly directional beam of ions 371 may be angled relative to the semiconductor IC device 300 by angling ions 371 that initially travel toward the semiconductor IC device 300 in the direction normal to the major surface of the substrate 302. The highly directional beam of ions 371 may then be subsequently diverted or angled, or the like, prior to the ions 371 colliding with the semiconductor IC device 300. The opposing nature of angled ions 371, relative to the ions 370 of the first etch stage, generally enlarge gate cut opening 362 and/or the gate cut trench 361 within the one or more replacement gate structure(s) 394.

For clarity, each of the highly directional beam of ions 371 that can collide with semiconductor IC device 300 may be similarly angled, prior to colliding with semiconductor IC device 300. Consequently, one or more sidewalls of the angled gate cut opening(s) 362 and/or each of the angled gate cut trench(es) 361 within the one or more replacement gate structure(s) 394 may be substantially parallel, as depicted. For example, and as depicted in the Y cross-section, right sidewall(s) of gate cut trench(es) 361 may be substantially parallel to right sidewall(s) gate cut opening(s) 362.

For clarity, the angle of the etch may be chosen so that the well or bottom surface of the angled gate cut opening(s) 362 and/or the well or bottom surface of the angled gate cut trench(es) 361 within the one or more replacement gate structure(s) 394 still land on STI region 304 located between neighboring nanosheet stacks 320. For example, the angle of the etch may be chosen so that the gate cut trench(es) 361 within the one or more replacement gate structure(s) 394 are angled toward active region $\mathbf{321_2}$ but land on STI region 304 that is located between active region $\mathbf{321_1}$ and active region $\mathbf{321_2}$, as opposed to landing on nanolayer stack 320 that is associated with active region $\mathbf{321_2}$.

In an alternative implementation, as depicted in FIG. 21, the highly directional beam of ions 371 may angled relative to the semiconductor IC device 300 by angling semiconductor IC device 300 relative to the highly directional beam of ions 371. For example, a chuck that holds the semiconductor IC device 300 may be angled with respect to the highly directional beam of ions 371 to enlarge the gate cut opening 362 and/or the gate cut trench 361 within the one or more replacement gate structure(s) 394.

For clarity, the gate cut opening 362 and/or the gate cut trench 361 within the one or more replacement gate structure(s) 394 may be referred herein as the inverted gate cut opening 362 and/or the inverted gate cut trench 361, due to the opposing angled etch stages and resulting smaller length and/or width at the top (e.g., dimension a) thereof, relative to the length and/or width at the bottom (e.g., dimension b). The resulting inverted trapezoidal cross sectional perimeter, as depicted in the Y view, of the inverted gate cut opening 362 and/or the inverted gate cut trench 361 may be constant from the gate spacer 340 on one side of the replacement gate structure 394 to the gate spacer 140 on the other side of the replacement gate structure 394 and may be generally orthogonal to the replacement gate structure 394 (e.g., 90 degrees across the replacement gate structure 394, parallel to the depicted X view plane, etc.).

Figure 18:
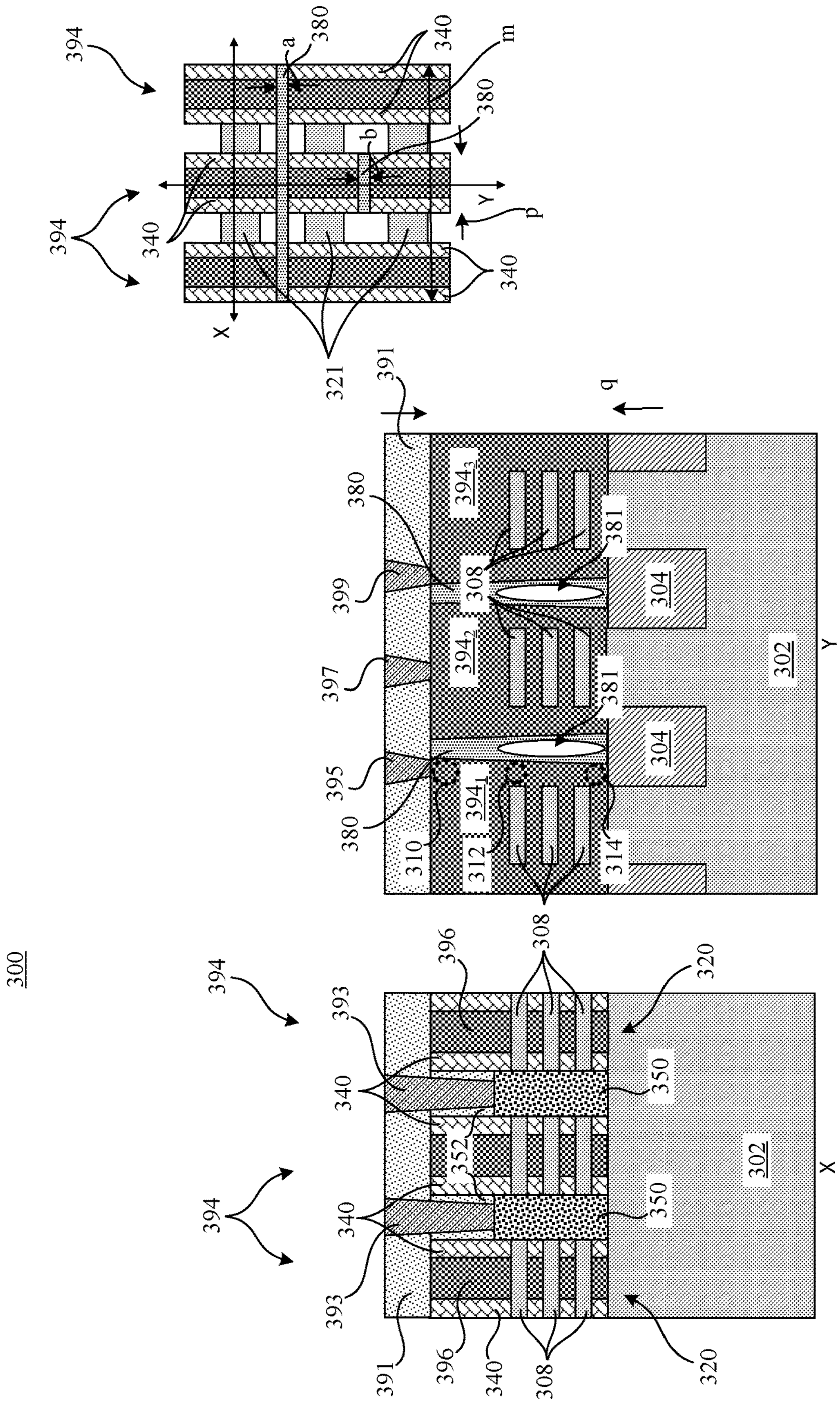

FIG. 18 depicts cross-sectional views of semiconductor IC device 300 shown after representative fabrication operation(s), in accordance with one or more embodiments. In the depicted fabrication stage, a gate cut region 380 is formed within the inverted gate cut opening 362 and/or the inverted gate cut trench 361 within the replacement gate structure(s) 394 and an air pocket 381 may be formed within the gate cut region. Further, in the depicted fabrication stage, ILD 391 is formed and one or more frontside contacts 393, 395, 397, and 399 are formed.

Air pocket 381 may be a material void or airgap and is present gate cut region 380. The air pocket 381 may reduce the parasitic capacitance between replacement gate structure(s) 394, relative to the gate cut region 380 without the air pocket 381.

In some embodiments, the air pocket 381 results from a deposition process of a gate cut dielectric layer in combination with a predefined relationship between a top areal area of the inverted gate cut opening 362 and/or the inverted gate cut trench 361 at the top of the replacement gate structure(s) 394 (e.g., dimension a by dimension o) versus the thickness of the replacement gate structure(s) 394 (e.g., dimension q). For example, when the top areal area is sufficiently small compared to the thickness of the replacement gate structure(s) 394, the material of the gate cut dielectric layer that accumulates on the sides of the inverted gate cut opening 362 and/or the inverted gate cut trench 361 more quickly than on the adjacent surfaces, enabling the material of the gate cut dielectric layer to build up and close on itself at the respective top of the inverted gate cut opening 362 and/or the inverted gate cut trench 361.

In this way, the gate cut dielectric material may fail to occupy a respective internal region of the inverted gate cut opening 362 and/or the inverted gate cut trench 361. As such, air pocket 381 may be encapsulated by the gate cut dielectric material that is located between adjacent replacement gate structures 394. In some embodiments, the horizontal width of the air pocket 381 (e.g., as shown in the Y-view) is less than the vertical height of the air pocket 381, as depicted.

Different instances of air pocket 381 can have relative differences in shape, size, location, or the like, because of manufacturing tolerance effects and/or to independently improve or optimize parasitic capacitance decreases between adjacent gate structures.

For clarity, while referred to as an "air pocket" in this description, the air pocket 381 may contain gases different from those commonly associated with air and its composition. As such, air pocket 381 can also be referred to as a void, a gas bubble, or other terminology. Also, the void or air pocket 381 can be distinguished from small imperfections that may be randomly positioned throughout a material, the void the like, based on having a significantly greater size and being aligned within the gate cut region 380. For example, the void or air pocket 381 has a Y view cross-sectional size of at least 1 nm wide by 2 nm tall in some embodiments. In other embodiments, the air pocket 381 has a horizontal dimension of at least half that of the associated vertical dimension. Further, while illustrated in the Y-view, as having an oval cross-sectional shape, such shape may not represent the actual shape and the void or air pocket 381 can have other cross-sectional shapes, including round, rectangular with rounded corners, trapezoidal, rectangular, and irregular shapes.

The gate cut dielectric layer may be formed by depositing a dielectric material, such as, for example, porous silicates, carbon doped oxides, silicon dioxides, silicon nitrides, silicon oxynitrides, or other dielectric materials. Any appropriate deposition technique for forming the gate cut dielectric layer can be utilized. The gate cut dielectric layer can be formed using, for example, CVD, PECVD, ALD, flowable CVD, spin-on dielectrics, or PVD.

In an example, the gate cut dielectric layer may be formed within the inverted gate cut opening 362 and/or within the inverted gate cut trench 361, upon the ILD 352, upon the gate spacers 340, and upon the one or more replacement gate structure(s) 394 to a thickness above the replacement gate structure(s) 394 and subsequently planarized by a subtractive removal technique, such as a CMP. This subtractive removal technique may expose the replacement gate structure(s) 394. Generally, the gate cut dielectric layer material that remains or is within the inverted gate cut opening 362 and/or remains or is within the inverted gate cut trench 361 forms the gate cut region 380. As such, the respective top surfaces of the sacrificial gate(s) 336, gate spacers 340, ILD 352, and gate cut region 380 instances may be coplanar.

In another example, the one or more gate cut regions 380 and the ILD 391 are the same material and may be formed during the same blanket dielectric material deposition stage. For example, the one or more gate cut regions 380 and the ILD 391 can be formed using, for example, CVD, PECVD, ALD, flowable CVD, spin-on dielectrics, or PVD. In an example, the one or more gate cut regions 380 and the ILD 391 may be formed to a thickness above the top surface of the semiconductor IC device 300. After deposition of the one or more gate cut regions 380 and the ILD 391, a planarization process, such as a chemical mechanical polish (CMP), may be performed to create a planar upper surface for the semiconductor IC device 300.

Generally, the gate cut region 380 separates adjacent and inline replacement gate structure(s) 394. For example, gate cut region 380 instances separate adjacent replacement gate structure(s) $\mathbf{394}_1$, $\mathbf{394}_2$, and $\mathbf{394}_3$ that are inline between the same gate spacer(s) 340. The air pocket 381 may reduce the parasitic capacitance between adjacent gate structures. For example, the air pocket 381 within the gate cut region 380 instances that separate adjacent replacement gate structure(s) $\mathbf{394}_1$, $\mathbf{394}_2$, and $\mathbf{394}_3$ may relatively reduce the parasitic capacitance between the replacement gate structure(s) $\mathbf{394}_1$, $\mathbf{394}_2$, and $\mathbf{394}_3$ compared to a gate cut dielectric instances with no air pocket. Reduction of such parasitic capacitance(s) may improve performance of the semiconductor IC device 300 and may allow for further semiconductor IC device scaling.

If not formed along with gate cut region(s) 380, the ILD 391 may be formed upon one or more replacement gate structures 394, upon the gate spacer(s) 340, upon ILD 352, upon the gate cut region 380 instances, or the like. The ILD 391 can be any suitable dielectric material, such as, for example, porous silicates, carbon doped oxides, silicon dioxides, silicon nitrides, silicon oxynitrides, or other dielectric materials. The ILD 391 can be formed using, for example, CVD, PECVD, ALD, flowable CVD, spin-on dielectrics, or PVD.

The one or more frontside contacts may formed in predetermined locations where a frontside contact is desirable to contact an underlying structure, such as a S/D region 350, replacement gate structure 394, or the like. For instance, in one example, frontside contact 393 may be formed to meld or connect with the underlying S/D region 350. In another example, a frontside contact 395 may be formed to meld or connect with the underlying replacement gate structure $394_1$, a frontside contact 397 may be formed to meld or connect with the underlying replacement gate structure $394_2$, and/or a frontside contact 399 may be formed to meld or connect with the underlying replacement gate structure $394_3$.

The frontside contacts may be formed by initially forming frontside contact openings within ILD 391, within ILD 352, as appropriate depending upon the location and/or type of the frontside contact to be formed. The formation of the frontside contact openings may include one or more etches to remove the applicable ILD material(s) to expose respective portions of the S/D regions 350 and respective portions of replacement gate structures $394_1$, $394_2$, and/or $394_3$.

Frontside contacts 393, 395, 397, and/or 399 may be formed by depositing conductive material within the frontside contact openings. The formation of the frontside contacts 393, 395, 397, and/or 399 may include forming a blanket conductive barrier layer extending into the frontside contact openings, depositing a metal or conductive material over the blanket conductive barrier layer, and performing a planarization process, such as a CMP process or a mechanical grinding process, to remove excess portions of the conductive barrier layer and the conductive material. Frontside contacts 393, 395, 397, and/or 399 may consist of a liner formed of Ni, NiPt, Ti, TiN, TaN, etc. and a conductive fill thereupon, such as Al, Ru, W, Co, Cu, etc. In some implementations, the formation of frontside contacts 393, 395, 397, and/or 399 may be a part of middle of the line (MOL) fabrication processes.

The frontside contacts 393, 395, 397, and/or 399 may be connected to a power rail or a signal line within a frontside back end of the line (BEOL) network. The power rail may provide power potential (VDD, VSS, or the like) to the structure associated with the frontside contact (e.g., S/D region 350, replacement gate structure 394, etc.). A power rail is defined herein as a conductive feature, such as a wire, trace, plane, or the like, that is configured to electrically carry a logical electrical potential that does not change over a steady state period.

The frontside contacts 393, 395, 397, and/or 399 may be connected to a signal line within the frontside BEOL network and electrically carry a functional or logical potential or signal that is to change or is otherwise dynamic within the steady state period. The power rail potential, the signal line potential, the threshold voltage of the transistor, and/or the like, may determine whether the associated transistor is on or off.

The inverted gate cut region(s) 380 result in a relatively larger top surface area of replacement gate structure 394 compared to a bottom surface area of replacement gate structure 394. As the top surface of replacement gate structure 394 is typically a landing area for a frontside gate contact, the inverted gate cut region(s) 380 may increase the landing area to a respective frontside gate contact. Because of the increased landing area, there is an increased propensity of the frontside gate contact to contact or meld with the underling replacement gate structure 394, as depicted. For example, there is a relatively increased volume of replacement gate structure 394, depicted by region 310 thereof. This increased landing area of replacement gate structure 394 further enables a frontside contact to be placed in further outward locations associated with the region 310, which may reduce routing complexities in certain instances.

Further, the inverted gate cut regions 380 result in improved resistance characteristics through replacement gate structure 394. Specifically, the inverted gate cut regions 380 cause a relatively wide region 312, compared to the narrow region 40, depicted in FIG. 1, between the top active nanolayer (i.e., the top channel) and the gate cut region. The wide region 312 provides an advantageously relatively lower electrical resistance therethrough, compared to the narrow region 40. Similarly, the inverted gate cut regions 380 cause a bottom perimeter region 314 with relatively less conductive material, relative to the bottom perimeter region 42, depicted in FIG. 1, nearest the replacement gate structure 194 bottom surface perimeter edge. This decrease in conductive material advantageously and relatively reduces the parasitic capacitance of the semiconductor IC device 300.

Figure 19:
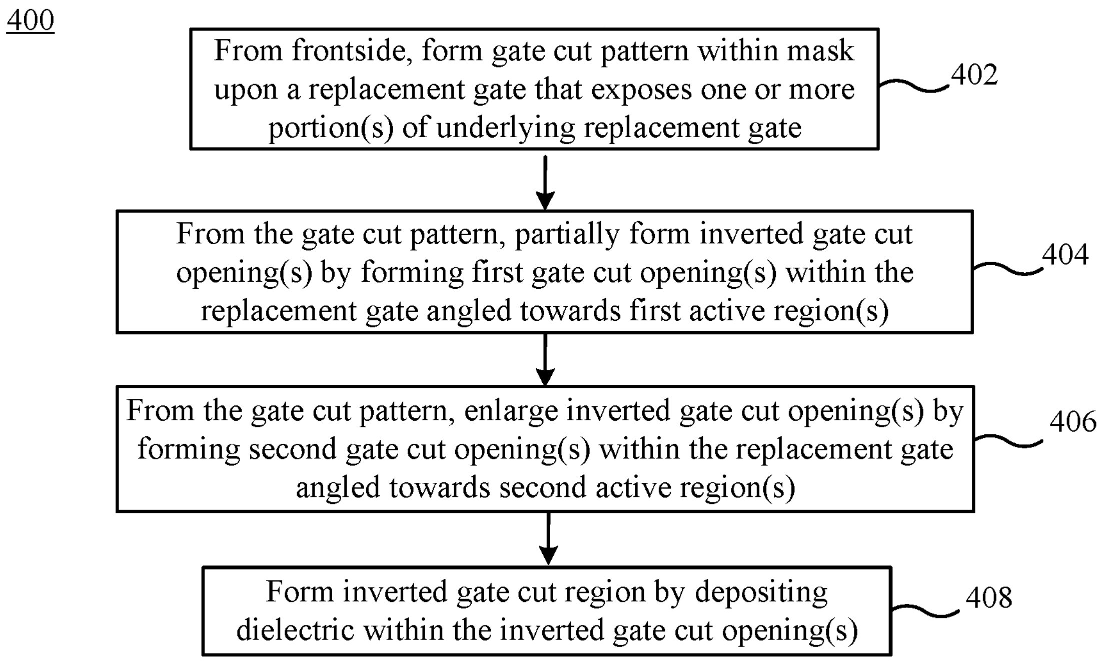
FIG. 19 depicts a flow diagram illustrating a semiconductor IC device fabrication method to fabricate a semiconductor IC device that includes a gate structure that is separated into distinct gate structures by an inverted gate cut region, in accordance with one or more embodiments of the disclosure.

FIG. 19 depicts a flow diagram illustrating method 400 to fabricate semiconductor IC device, such as semiconductor IC device 300, that includes inverted gate cut region fabricated with a gate first process, according to one or more embodiments of the present disclosure. The depicted fabrication operations of method 400 may be illustrated and described above with reference to one or more of FIG. 14 through FIG. 18 of the drawings. The method 400 depicted herein is representative, as there can be many variations to the diagram or operations described therein without departing from the spirit of the embodiments. For instance, the operations can be performed in a differing order, or operations can be added, deleted, or modified. For instance, method 400 may be described with reference to the fabrication of semiconductor IC device 300, though method 400 may be utilized to fabricate other semiconductor IC devices that include one or more inverted gate cut regions.

At block 402, method 400 includes, from the frontside of the semiconductor IC device, forming a gate cut pattern within a mask that is upon a replacement gate, the pattern of the mask may expose one or more portion(s) of an underlying and associated replacement gate. For example, as depicted in FIG. 15, the gate cut mask 360 is patterned and the patterned gate cut mask 360 is used to locate the gate cut opening 362 and/or the gate cut trench 361 upon the conductive fill gate(s) 396.

At block 404, method 400 may continue with, from the gate cut pattern within the gate cut mask 360, partially forming inverted gate cut opening(s) in a first etch stage by forming first gate cut opening(s) within the replacement gate that are angled towards respective first active region(s). For example, the gate cut opening 362 and/or the gate cut trench 361 is etched in the first etch stage, by a highly directional beam of ions 370 that are angled relative to the semiconductor IC device 300, into the conductive fill gate(s) 396. In a particular implementation, the first etch stage forms the gate cut trench 361 angled toward active region $321_1$ and forms the gate cut opening 362 angled toward active region $321_2$.

At block 406, method 400 may continue with, from the gate cut pattern within the gate cut mask, further forming the inverted gate cut opening(s) in a second etch stage by forming second gate cut opening(s) within the replacement gate that are angled towards respective second active region(s). For example, the gate cut opening 362 and/or the gate cut trench 361 is enlarged by the second etch stage, by the highly directional beam of ions 371 that are angled relative to the semiconductor IC device 300, into the conductive fill gate(s) 396. In a particular implementation, the second etch stage enlarges the gate cut trench 361 by the second gate cut opening(s) angled toward active region $321_2$ and forms the gate cut opening 362 by the second gate cut opening(s) angled toward active region $321_3$.

At block 408, method 400 may continue with forming one or more inverted gate cut region(s) by depositing a dielectric or electrically insulating material within the inverted gate cut opening(s). For example, inverted gate cut region 380 is formed within the inverted gate cut opening 362 and/or the inverted gate cut trench 361. Due to the inverted geometry of the inverted gate cut opening 362 and/or the inverted gate cut trench 361, air pocket 381 may be formed within the inverted gate cut region 380 due to the dielectric or electrically insulating material pinching off on itself at the top of the inverted gate cut opening 362 and/or the top of the inverted gate cut trench 363 prior to fully filling the inverted gate cut opening 362 and/or the inverted gate cut trench 361.

Figure 22:
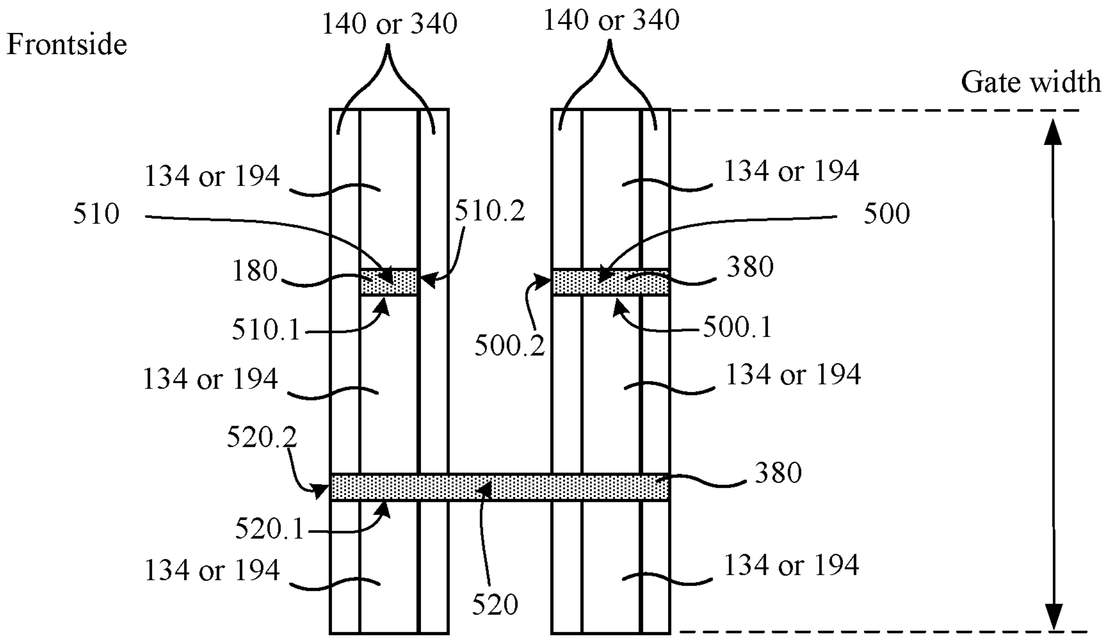
FIG. 22 depicts a frontside surface of an inverted gate cut region, in accordance with one or more embodiments of the disclosure.
Figure 23:
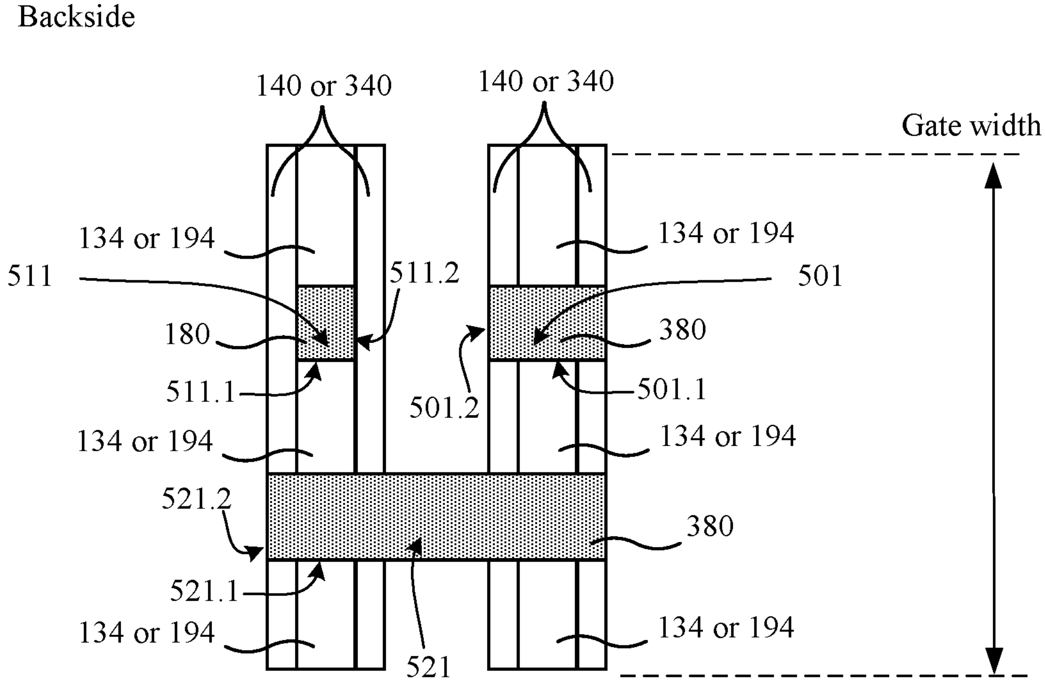
FIG. 23 depicts a backside surface of an inverted gate cut region, in accordance with one or more embodiments of the disclosure.

For clarity, FIG. 22 and FIG. 23 depict frontside and backside views of inverted gate cut regions which have relatively smaller frontside or top surface areas (i.e., FIG. 22) compared to their respective backside or bottom surface areas (i.e., FIG. 23).

Referring to FIG. 22 which depicts a frontside or top surface view of inverted gate cut regions, according to embodiment of the disclosure. As is exemplarily depicted, inverted gate cut region 180 has a frontside or top surface area 510 formed by a top surface dimension 510.1 that is orthogonal to the associated gate width by a top surface dimension 510.2 that is parallel to the associate gate width. Dimension 510.1 may be substantially the same as the associated gate length or the dimension between the inner sidewalls of the associated gate spacers 140.

Similarly, an inverted gate cut region 380 has a frontside or top surface area 500 formed by a top surface dimension 500.1 that is orthogonal to the associated gate width by a top surface dimension 500.2 that is parallel to the associate gate width. Dimension 500.1 may be the dimension between the outer sidewalls of the associated gate spacers 340. Similarly, an inverted gate cut region 380 has a frontside or top surface area 520 formed by a top surface dimension 520.1 that is orthogonal to associated gate widths of multiple gates by a top surface dimension 520.2 that is parallel to the associate gate widths. Dimension 520.1 may be the dimension between outer sidewalls of gate spacers 340 associated with two or more different gates.

Referring to FIG. 23 which depicts a backside or bottom surface view of inverted gate cut regions, according to embodiment of the disclosure. As is exemplarily depicted, inverted gate cut region 180 has a backside or bottom surface area 511 formed by a bottom surface dimension 511.1 that is orthogonal to the associated gate width by bottom surface dimension 511.2 that is parallel to the associate gate width. Dimension 511.1 may be substantially the same as dimension 510.1. Dimension 511.2 is greater than dimension 510.2. Therefore, backside or bottom surface area 511 is greater than frontside or top surface area 510.

Similarly, an inverted gate cut region 380 has a backside or bottom surface area 501 formed by a bottom surface dimension 501.1 that is orthogonal to the associated gate width by a bottom surface dimension 501.2 that is parallel to the associate gate width. Dimension 501.1 may be substantially the same as dimension 500.1. Dimension 501.2 is greater than dimension 500.2. Therefore, backside or bottom surface area 501 is greater than frontside or top surface area 500.

Similarly, an inverted gate cut region 380 has a backside or bottom surface area 521 formed by a bottom surface dimension 521.1 that is orthogonal to associated gate widths of multiple gates by a bottom surface dimension 521.2 that is parallel to the associate gate widths. Dimension 521.1 may be substantially the same as dimension 520.2. Dimension 521.2 is greater than dimension 520.2. Therefore, backside or bottom surface area 521 is greater than frontside or top surface area 520.

The semiconductor IC devices disclosed herein may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments described. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments described herein.

Various embodiments of the present disclosure are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all of the points of both of the surfaces. As used herein, the term "substantially" refers to an extent to which minor deviations are included such that the deviations do not impact the desired result. Accordingly, two surfaces may be referred to as substantially coplanar despite deviations from coplanarity on an atomic scale, so long as those deviations do not impact the desired result of the coplanarity."

What is claimed is:

1. A semiconductor integrated circuit (IC) device comprising:

a gate structure between a first gate spacer and a second gate spacer, the gate structure comprising a first gate and a second gate;

an inverted gate cut region between the first gate spacer and the second gate spacer, wherein the inverted gate cut region separates the first gate from the second gate and comprises a bottom surface and a top surface, wherein a surface area of the top surface is smaller than a surface area of the bottom surface; and a first transistor associated with the first gate, wherein the first transistor comprises a top channel that is vertically above a bottom channel, and wherein a first dimension between the top channel and the inverted gate cut region is greater than a second dimension between the bottom channel and the inverted gate cut region.

2. The semiconductor IC device of claim 1, further comprising:

an air pocket within the inverted gate cut region.

3. The semiconductor IC device of claim 1, wherein the gate structure is a replacement gate structure.

4. The semiconductor IC device of claim 1, wherein the gate structure is a sacrificial gate structure.

5. The semiconductor IC device of claim 1, wherein the first gate comprises a frontside contact landing area that is greater than a bottom surface area of the first gate.

6. A semiconductor integrated circuit (IC) device comprising:

a gate structure between a first gate spacer and a second gate spacer, the gate structure comprising a first gate and a second gate;

an inverted gate cut region between the first gate spacer and the second gate spacer, wherein the inverted gate cut region separates the first gate from the second gate and comprises a bottom surface width and a top surface width that is smaller than the bottom surface width; and a first transistor associated with the first gate, wherein the first transistor comprises a top channel that is vertically above a bottom channel, and wherein a first distance between the top channel and the inverted gate cut region is greater than a second distance between the bottom channel and the inverted gate cut region.

7. The semiconductor IC device of claim 6, further comprising:

an air pocket within the inverted gate cut region.

8. The semiconductor IC device of claim 6, wherein the gate structure is a replacement gate structure.

9. The semiconductor IC device of claim 6, wherein the gate structure is a sacrificial gate structure.

10. The semiconductor IC device of claim 6, wherein the first gate comprises a frontside contact landing area that is greater than a bottom surface area of the first gate.

* * * * *